(12) United States Patent
Cakmak et al.

(10) Patent No.: US 11,957,058 B2
(45) Date of Patent: *Apr. 9, 2024

(54) PIEZOELECTRIC TRANSDUCERS BASED ON VERTICALLY ALIGNED PZT AND GRAPHENE NANOPLATELETS

(71) Applicant: Purdue Research Foundation, West Lafayette, IN (US)

(72) Inventors: Mukerrem Cakmak, West Lafayette, IN (US); Armen Yildirim, West Lafayette, IN (US); Rahim Rahimi, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/111,545

(22) Filed: Feb. 18, 2023

(65) Prior Publication Data
US 2023/0240146 A1 Jul. 27, 2023

Related U.S. Application Data

(63) Continuation of application No. 16/699,084, filed on Nov. 28, 2019, now Pat. No. 11,588,097, which is a
(Continued)

(51) Int. Cl.
*C08K 3/04* (2006.01)
*H01L 41/08* (2006.01)
(Continued)

(52) U.S. Cl.
CPC ......... *H10N 30/852* (2023.02); *H04R 17/005* (2013.01); *H10N 30/875* (2023.02); *H10N 30/878* (2023.02)

(58) Field of Classification Search
CPC .............. H10N 30/85–886; C08J 5/18; C08K 3/041; C08K 3/042; C08K 3/11
See application file for complete search history.

(56) References Cited

U.S. PATENT DOCUMENTS

| 11,588,097 | B2* | 2/2023 | Cakmak | H04R 29/001 |
| 2016/0181506 | A1* | 6/2016 | Sirbuly | H10N 30/092 |
| | | | | 264/41 |

(Continued)

*Primary Examiner* — Matthew E. Hoban
(74) *Attorney, Agent, or Firm* — Piroozi-IP, LLC

(57) ABSTRACT

A method of transducing electrical energy to sound is disclosed which includes providing a transducer, the transducer includes lead zirconate titanate (PZT) particles mixed with graphene nanoplatelets (GNPs) in a flexible substrate aligned in a first direction, forming a transducer subsystem, a first conductive protective electrode having a width and a length configured to provide a first electrical connectivity to an external circuit, and a second conductive protective electrode having the width and the length and configured to provide a second electrical connectivity to the external circuit, wherein the transducer subsystem is sandwiched between the first and second conductive protective electrodes, and providing an external circuit configured to provide an electrical signal to the first and second conductive protective electrodes to thereby transduce the electrical signal to sound.

17 Claims, 45 Drawing Sheets
(38 of 45 Drawing Sheet(s) Filed in Color)

Related U.S. Application Data continuation-in-part of application No. 16/167,714, filed on Oct. 23, 2018, now Pat. No. 11,203,675.

(60) Provisional application No. 62/772,144, filed on Nov. 28, 2018, provisional application No. 62/576,601, filed on Oct. 24, 2017.

(51) Int. Cl.
*H01L 41/18* (2006.01)
*H04R 17/00* (2006.01)
*H10N 30/85* (2023.01)
*H10N 30/87* (2023.01)

(56) References Cited

U.S. PATENT DOCUMENTS

2016/0218642 A1* 7/2016 Mesa ................. H02N 2/18
2017/0373243 A1* 12/2017 Ozawa ................ B06B 1/0607

* cited by examiner

Directivity comparison at 10 kHz

Measurement angle = 0°

@ 3 kHz

@ 10 kHz

PIEZOELECTRIC TRANSDUCERS BASED ON VERTICALLY ALIGNED PZT AND GRAPHENE NANOPLATELETS

CROSS REFERENCE TO RELATED APPLICATIONS

This patent application is a continuation patent application of and related to and claims the priority benefit of U.S. Non-Provisional patent application Ser. No. 16/699,084 filed Nov. 28, 2019 now U.S. Pat. No. 11,588,097 to Cakmak et al., which is a continuation-in-part application of and related to and claims the priority benefit of U.S. Non-Provisional patent application Ser. No. 16/167,714 filed Oct. 23, 2018 and which claims the benefit of U.S. Provisional Application No. 62/576,601, filed Oct. 24, 2017, as well as the priority benefit of U.S. Provisional Patent Application Ser. No. 62/772,144 filed Nov. 28, 2018, the contents of each of which are incorporated herein by reference into the present disclosure.

STATEMENT REGARDING GOVERNMENT FUNDING

This invention was made without government support.

TECHNICAL FIELD

The present disclosure generally relates to transducers, and particularly to transducers constructed with vertically aligned lead zirconate titanate (PZT) and graphene nanoplatelets.

BACKGROUND

This section introduces aspects that may help facilitate a better understanding of the disclosure. Accordingly, these statements are to be read in this light and are not to be understood as admissions about what is or is not prior art.

The potential impacts of wearable technologies have become more evident with the introduction of the "Internet of Things" (IoT), which can basically be described as a smart network where every electronic device is connected to each other through embedded sensors and the Internet. As a result, there is an increasing demand for the use of flexible, ultra-lightweight and transparent sensors and nanogenerators for self-powered electronics adapted for use in a wide range of applications, as a nonlimiting example, personal health monitoring, soft robotics, human-inspired electronic skin (e-skin), energy harvesting, and biomedical applications. Among various types of available systems, piezoelectric materials and their polymer counterparts are attracting a great deal of attention due to their high levels of sensitivity and fast response times even at small deformations.

Among polymers, poly(vinylidene fluoride) (PVDF) and its copolymers, such as poly(vinylidene fluoride-co-trifluoroethylene) (PVDF-TrFE), are believed to exhibit the highest piezoelectric coefficient values. Ultra-high sensitive piezoelectric devices have been reported based on aligned nanofibers of PVDF-TrFE that can sense pressures as low as 0.1 Pa. Likewise, conformal piezoelectric devices have been reported based on lead zirconate titanate (PZT) that are capable of monitoring cutaneous pressure changes at very low pressure sensitivity levels (for example, about 0.005 Pa with 0.1 ms precision).

In addition to pressure sensors and other mechanical sensing devices, other notable applications for piezoelectric materials include kinetic energy harvesting for self-powered macroscale and nanoscale electronic devices. As an example, nanoscale mechanical energy has been converted into electrical energy by utilizing aligned zinc oxide (ZnO) nanowires as piezoelectric nanogenerators with an estimated power efficiency of 17 to 30%. Fully rollable nanogenerator systems have been introduced based on ZnO nanowires between chemical vapor deposition (CVD)-grown large scale graphene electrodes. Self-powered thin patch loudspeakers have been reported that are based on ferroelectret nanogenerators (FENGs). Such devices can be used in various areas ranging from sound recording thin films to microphones for privacy security applications. PZT and barium titanate ($BaTiO_3$) have also been utilized extensively for the development of nanogenerators and various other energy harvesting applications. Advanced piezoelectric devices have been reported based on PZT ribbons that harvest energy directly from the natural contraction and relaxation motions of the heart, lungs, and diaphragm. PZT nanotubes have been fabricated and utilized for power generation with diameter and length values of 200 nm and 58 μm, respectively. The PZT nanotube-based system was reportedly able to generate up to 469 mV when a steel nugget was dropped from different heights. PZT nanotube-based energy harvesters have been reported in which nanotubes were embedded into a polydimethylsiloxane (PDMS) matrix. The observed current and voltage outputs were reported to be around 54.5 nA and 1.52 V, respectively. The production of large area PZT and carbon nanotube-based nanocomposite generators have been demonstrated wherein 100 V voltage output and 10 μA current generation were reported during the application of irregular biomechanical deformations onto a 30 cm×30 cm sample. Chemical epitaxial growth of PZT nanowires and their application as a power source for wireless microelectronics have been reported as achieving an output voltage of 0.7 V with a power density of 2.8 mW $cm^3$.

Besides the aforementioned studies and innovations, the alignment of piezoelectric materials in a specific direction is capable of further improving the energy harvesting features of nanogenerators devices. A flexible nanogenerator with 209 V output voltage and a current density of 23.5 $\mu A/cm^2$ has been reported, wherein PZT fibers were aligned in a thickness (z) direction of a film. Furthermore, the dielectrophoretic properties of piezo compounds can also be utilized to achieve preferential alignment. As an example, the electric field induced alignment of PZT nanowires has been demonstrated wherein PZT nanowires were synthesized by an electrospinning technique and aligned in the z-direction under a uniform external electric field. It was observed that the alignment of the PZT particles drastically changed the piezoelectric properties of the composite material in terms of voltage and current output. The effect of the alignment of BaTiO3 nanofibers in vertical and horizontal modes has also been reported. In one case, a maximum voltage of 2.67 V and a current of 261.40 nA was reported for BaTiO3 nanofibers vertically aligned in a PDMS matrix. Examples of such reporting are seen in "High Performance Flexible Piezoelectric Nanogenerators based on BaTiO3 Nanofibers in Different Alignment Modes," by Yan et al., and "A Transparent Antipeep Piezoelectric Nanogenerator to Harvest Tapping Energy on Screen," by Hu et al.

Dynamic speakers, as known to a person having ordinary skill in the art, generally include a diaphragm, a voice coil which is mechanically coupled to the diaphragm, and a magnetic circuit acting on the voice coil causing it to move the diaphragm thereby moving outside surrounding air in response to the movement of the diaphragm. A diagram according to the U.S. Pat. No. 6,621,912 to Sugiyama et al. is shown in FIG. 35. Loudspeakers are ubiquitous. In particular, due to the growing demand for modern lightweight, thin, portable and flexible electronics, the integration of loudspeakers into next generation electronics have become essential. However, the traditional speaker design represent complex structures (above-stated components), inflexible forms, and limited functionality.

Several studies have already been suggested toward the development of a magnet free and flexible speakers utilizing piezoelectric or thermoacoustic effects and principles. However, loudspeakers achieving needed flexibility and scalability to large arbitrary sizes remain elusive. The same requirements apply to other forms of transducers, e.g., force transducers; and similarly flexibility and scalability of these other transducers also remain elusive.

Therefore, there is an unmet need for a novel transducer approach that can provide extraordinary amount of flexibility and that can be scalable to large arbitrary sizes

SUMMARY

A method of transducing electrical energy to sound is disclosed. The method includes providing a transducer. The transducer includes lead zirconate titanate (PZT) particles mixed with graphene nanoplatelets (GNPs) in a flexible substrate aligned in a first direction, forming a transducer subsystem, a first conductive protective electrode having a width and a length configured to provide a first electrical connectivity to an external circuit, and a second conductive protective electrode having the width and the length and configured to provide a second electrical connectivity to the external circuit, wherein the transducer subsystem is sandwiched between the first and second conductive protective electrodes. The method further includes providing an external circuit configured to provide an electrical signal to the first and second conductive protective electrodes to thereby transduce the electrical signal to sound.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
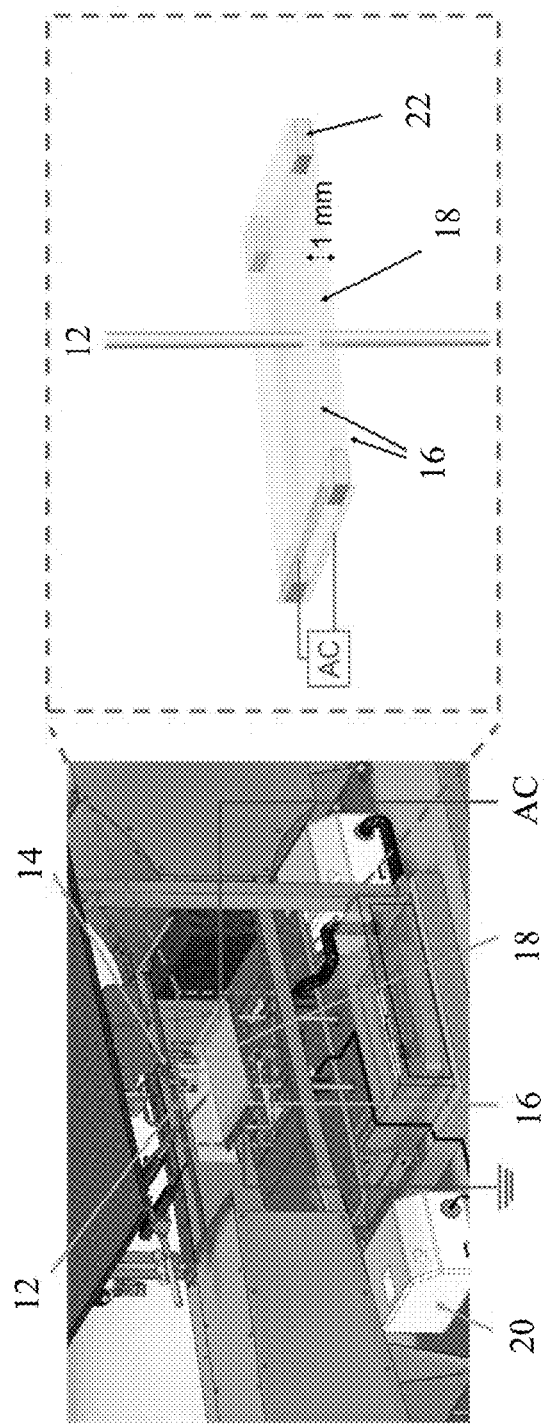
FIG. 1 schematically represents a real-time measurement system configured to track light transmission during electric field induced alignment. The inset represents the electric field alignment setup.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

The following describes machines and processes for producing polymer films, including piezoelectric polymer composite films (or simply, piezoelectric films) suitable for the fabrication of flexible multifunctional devices, as nonlimiting examples, nanogenerators and highly sensitive force and pressure sensors. The machines and processes are capable of providing for roll-to-roll (R2R) production of flexible transparent multifunctional devices in which lead zirconate titanate (PZT) particles and graphene nanoplatelets (GNPs) are aligned in a transparent polymer film, for example, polydimethylsiloxane (PDMS) or similar soft polymer matrix such as a polyurethane, silicone rubber, etc., to yield flexible and transparent PZT/GNP-based piezonanogenerators (PENGs) for self-powered electronics and sensor applications. The machines and processes are preferably implemented on continuous large-scale roll-to-roll production lines.

In investigations leading to the present disclosure, piezoelectric polymer composite films were produced by combining lead zirconate titanate (PZT) particles as piezoelectric fillers (0.50 vol %) and a small volume fraction (0.02 vol. %) of graphene nanoplatelets (GNPs) in a liquid polymer precursor matrix of polydimethylsiloxane (PDMS) commercially available from Dow Corning under the name Sylgard® 184. To promote the sensitivity and the energy harvesting properties of the piezoelectric composites, the PZT particles and GNPs were then aligned in the thickness (z) direction of the matrix by being subjected to a uniform electric field. Though graphene was used, other electrically conductive nanoparticles, including but not limited to other electrically conductive graphitic nanoparticles (e.g., single and multiwall carbon nanotubes, graphite etc.) could be used to increase the charge transport rate, and hence the sensitivity and the response time. Thermocurable PDMS was chosen for the matrix film material in view of its well-known properties in flexible electronics, such as high elasticity, optical transparency, and low cost. However, various other polymeric resins (e.g., thermo- and photocurable thermosets or thermoplastics) could be used, as nonlimiting examples, similar soft polymer materials such as a polyurethane or a silicone rubber. Though 0.50 vol % PZT concentration was selected for the investigation, it is believed that based on this and other investigations reported herein that suitable PZT concentrations in a given system may range from about 0.05 vol % to about 15 vol %, depending on the particular application. As examples, lower concentrations may be suitable for applications in which ultra-high sensitivity is not necessarily required, whereas higher concentrations may be suitable for high voltage output applications at the expense of transparency.

The PZT particles and GNPs were uniformly dispersed in the thermocurable PDMS resin using a planetary centrifugal mixer and then a curing agent for the PDMS was introduced into the mixture at a 1:10 ratio to the PDMS. A doctor-blade casting method was used to cast 150 μm-thick piezoelectric films between two indium tin oxide (ITO)-coated glass panels that served as bottom and top electrodes. The gap between the electrodes was kept constant at 1 mm by using glass spacers. The PZT particles within different films were then aligned at four different AC electric field strengths at a constant frequency (100 Hz): 250 V/mm, 500 V/mm, 750 V/mm, and 1000 V/mm. A real-time measurement system was developed and used to track the real-time light transmission during electric field alignment. The system, depicted in FIG. 1, included a zero-degree light transmission 12, light detector 14, transparent ITO coated glass 16, sample 18, light source 20, and glass spacers 22.

Figure 2:
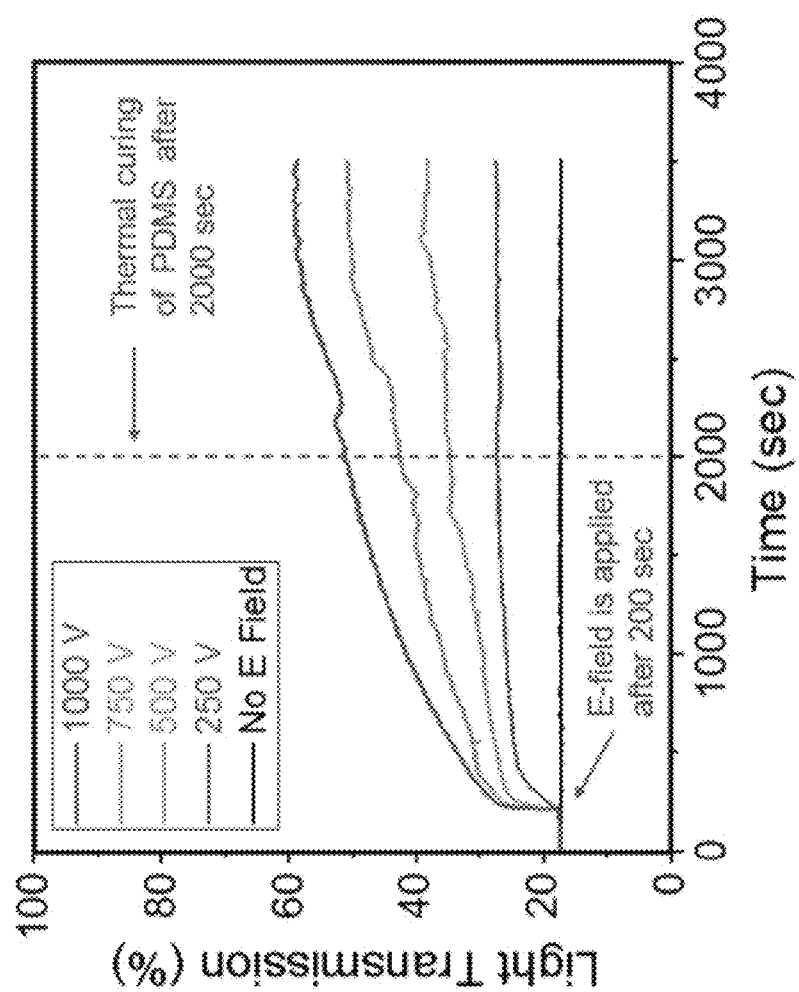
FIG. 2 is a graph that reveals the effect of applied field strength on light transmission through piezoelectric films produced to contain PZT particles in accordance with a nonlimiting embodiment of the present disclosure.
Figure 3:
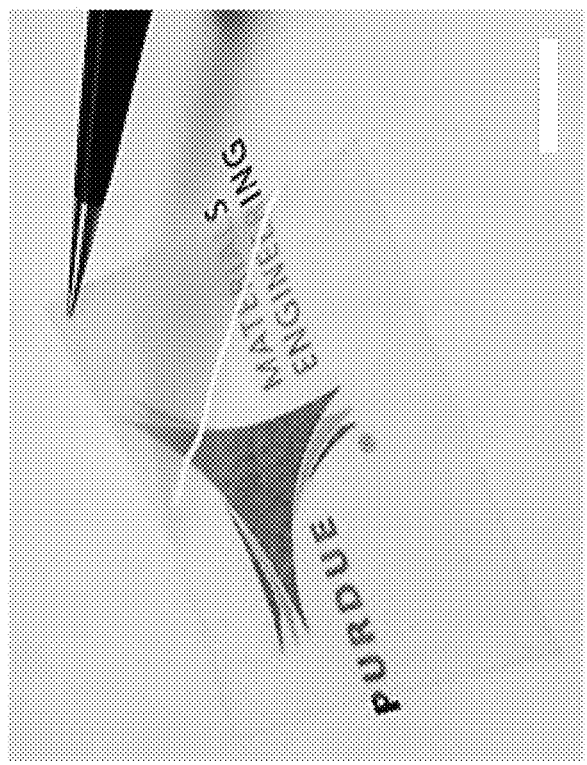
FIG. 3 contains an image showing an electric field aligned 150 μm-thick PZT/PDMS piezoelectric film.
Figure 4:
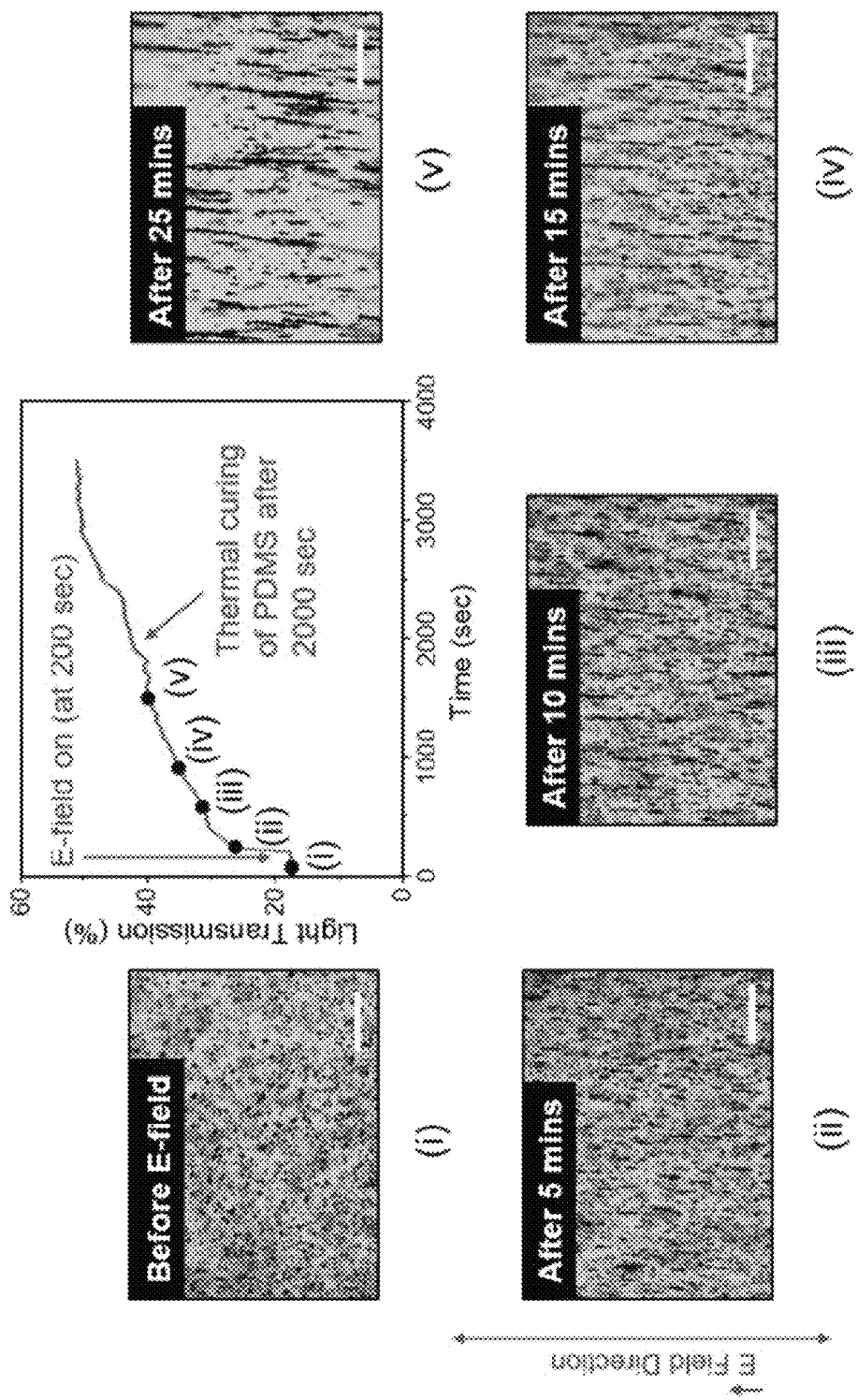
FIG. 4 evidences that within, the piezoelectric films, the PZT particles are progressively arranged in nano- and micro-columnar structures along the applied electric field direction.

FIG. 2 is a graph that reveals the effect of applied field strength on the light transmission through the piezoelectric films. When the electric field was applied after 200 seconds, a sharp increase in light transmission was observed due to the alignment of PZT particles in columns along the applied electric field. As shown in optical microscope images of FIG. 4, at this stage the PZT particles had assembled themselves into nano- and micro-columnar structures along the applied electric field direction, forming depletion zones in between which allowed light to travel through the films with less scattering and absorption losses. FIG. 3 shows the transparency level of a 150 μm thick PZT/PDMS sample aligned at 1000 V/mm (scale bar=1 cm). FIG. 4 shows the progressive alignment of PZT particles into nano- and micro-columnar structures resulting from an electric field ("E Field") strength of 750V/mm (scale bar=50 μm), in which image (i) was before application of the electric field and images (ii) through (v) were 5, 10, 15, and 25 minutes, respectively, after the application of the electric field. Light transmission sharply increased with increasing field strength and tended to saturate and level off over time. For a film subjected to a field strength of 1000 V/mm (FIG. 2), the light transmission started at about 18% and rose to about 60%, indicating the alignment of PZT particles in the direction of the applied electric field.

Figure 5:
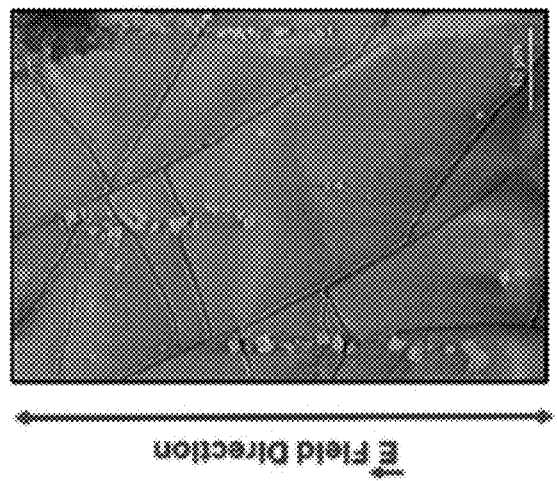
FIG. 5 contains scanning electron microscopy (SEM) images showing the effect of the applied electric field on the alignment of PZT particles.
Figure 5:
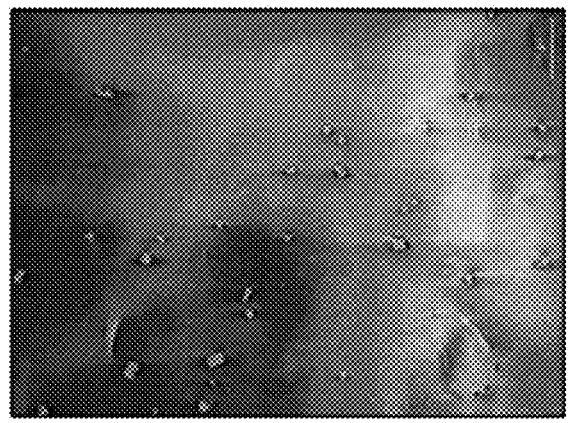

At 2000 seconds (i.e., after the application of the electric field for thirty minutes), the PDMS-based piezoelectric films were cured at a temperature of 85° C. for one hour to freeze the aligned PZT columns. The orientation of the PZT particles was observed under scanning electron microscopy (SEM), as shown in FIG. 5. Image (a) shows randomly distributed PZT particles prior to electric field alignment, and image (b) shows aligned PZT particles following electric field alignment (scale bar=10 μm). The PZT particles are artificially colored to increase the contrast.

Figure 9:
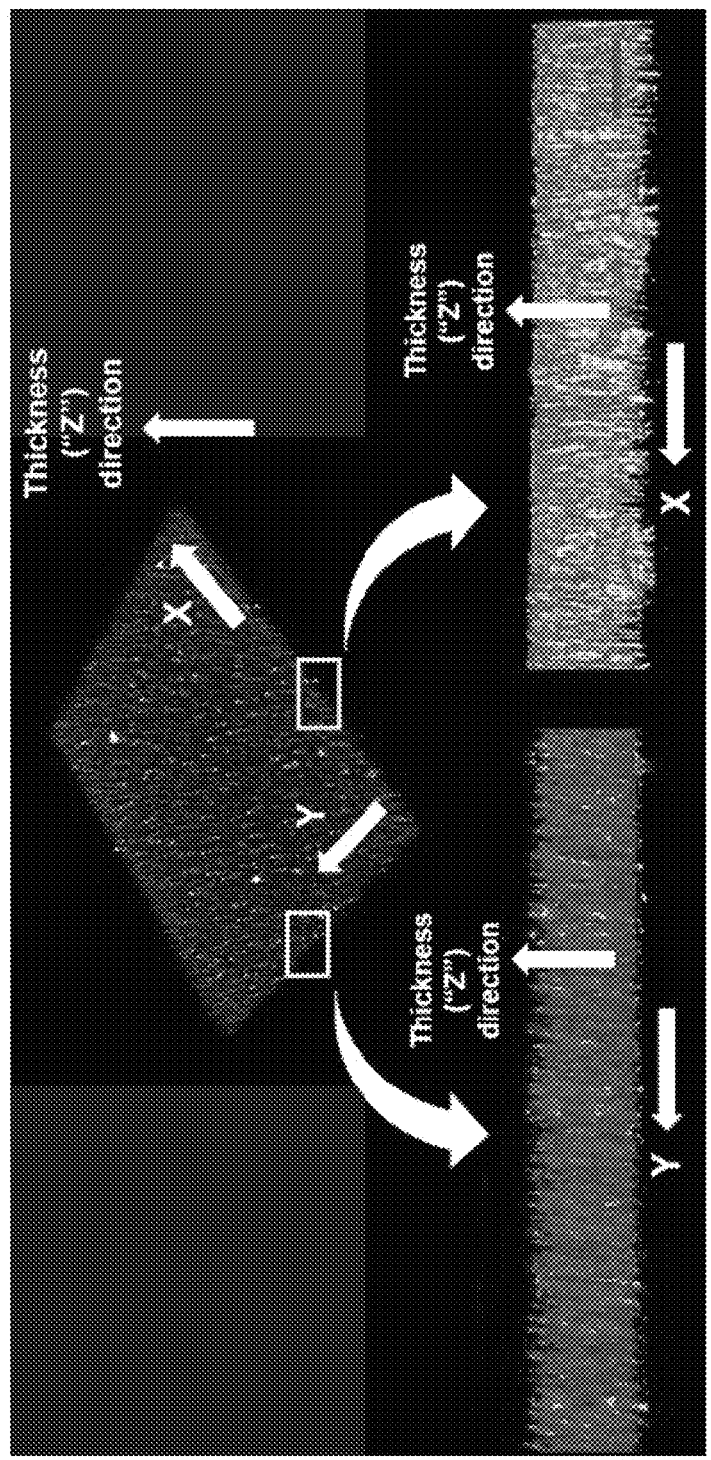
FIG. 9 contains micro-computed tomography (Micro CT) images of aligned PZT particles (scale bar: 100 μm).

To further demonstrate the degree of alignment, micro-computed tomography (Micro CT) images of aligned PZT particles are shown in FIG. 9. The micro-computed tomography images show the preferential alignment of the PZT particles along nanocolumns in the thickness direction of a piezoelectric film.

Figure 7:
FIG. 7 contains an image showing an electric field aligned 150 μm-thick PZT/GNPs/PDMS piezoelectric film.
Figure 11:
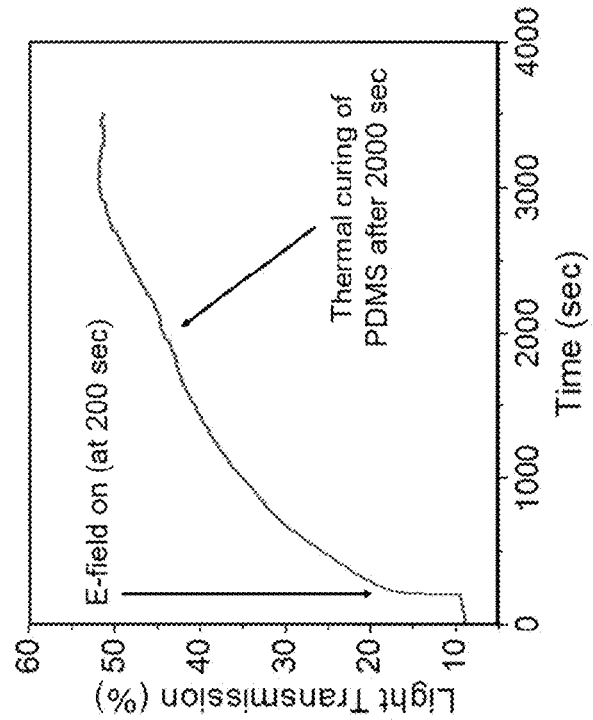
FIGS. 10 and 11 contain real-time light transmission data for two 150 μm-thick piezoelectric films, one a GNPs/PDMS system (0.02 vol. % GNPs) and the other a PZT/GNPs/PDMS system (0.5 vol. % PZT, 0.02 vol. % GNPs).
Figure 10:
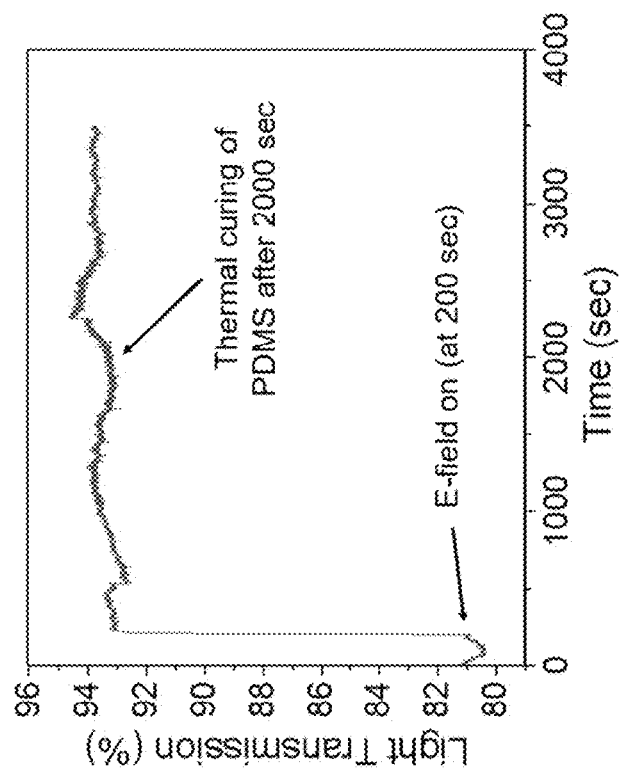

Real-time light transmission data for two 150 μm-thick piezoelectric films, one a GNPs/PDMS system (0.02 vol. % GNPs) and the other a PZT/GNPs/PDMS system (0.5 vol. % PZT, 0.02 vol. % GNPs), are provided in FIGS. 10 and 11, respectively. A uniform electric field was applied for 200 seconds and the samples were thermally cured after 2000 seconds. The light transmission for the GNPs/PDMS sample increased from about 81% to about 94% when subjected to the application of the electric field for 200 seconds, whereas light transmission for the PZT/GNPs/PDMS sample increased from about 8% and saturated around 52% when subjected to the application of the electric field for 200 seconds. FIG. 7 is an image showing the electric field-aligned 150 μm-thick PZT/GNPs/PDMS piezoelectric film (scale bar=1 cm).

Figure 8:
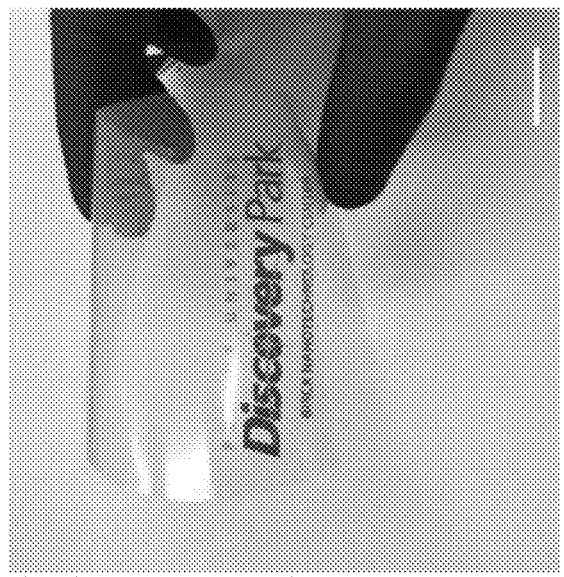
FIG. 8 contains an image showing an electric field-aligned 5 μm-thick PZT/GNPs/PDMS piezoelectric film cast on an ITO coated PET substrate.

FIG. 8 shows an electric field-aligned 5 μm-thick PZT/GNPs/PDMS piezoelectric film that had been cast on an ITO-coated polyethylene terephthalate (PET) substrate (scale bar=2 cm). The piezoelectric film exhibited around 90% optical transparency after electric field alignment.

Figure 6:
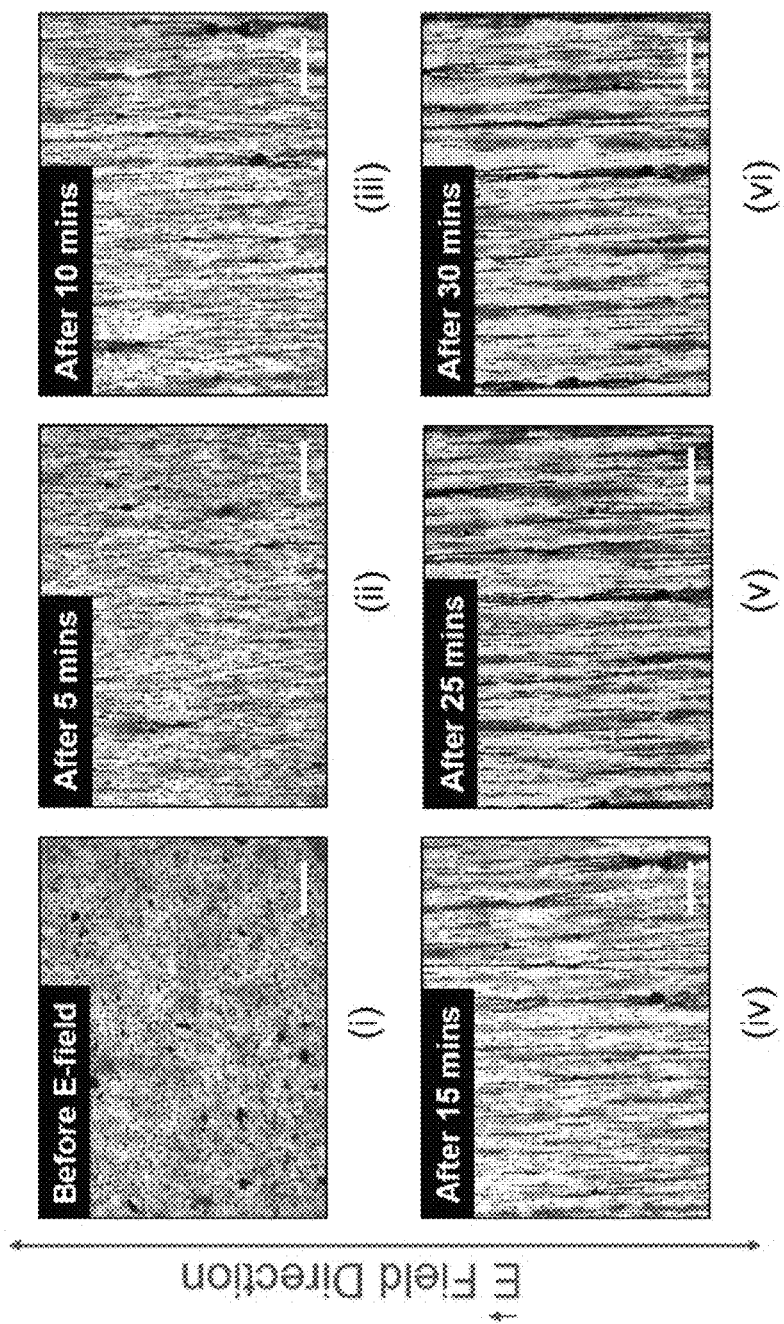
FIG. 6 contains an optical microscope image of a PZT/GNPs/PDMS film and shows the progressive formation of PZT/GNPs columns in the thickness (z) direction of the film during electric field alignment.
Figure 12:
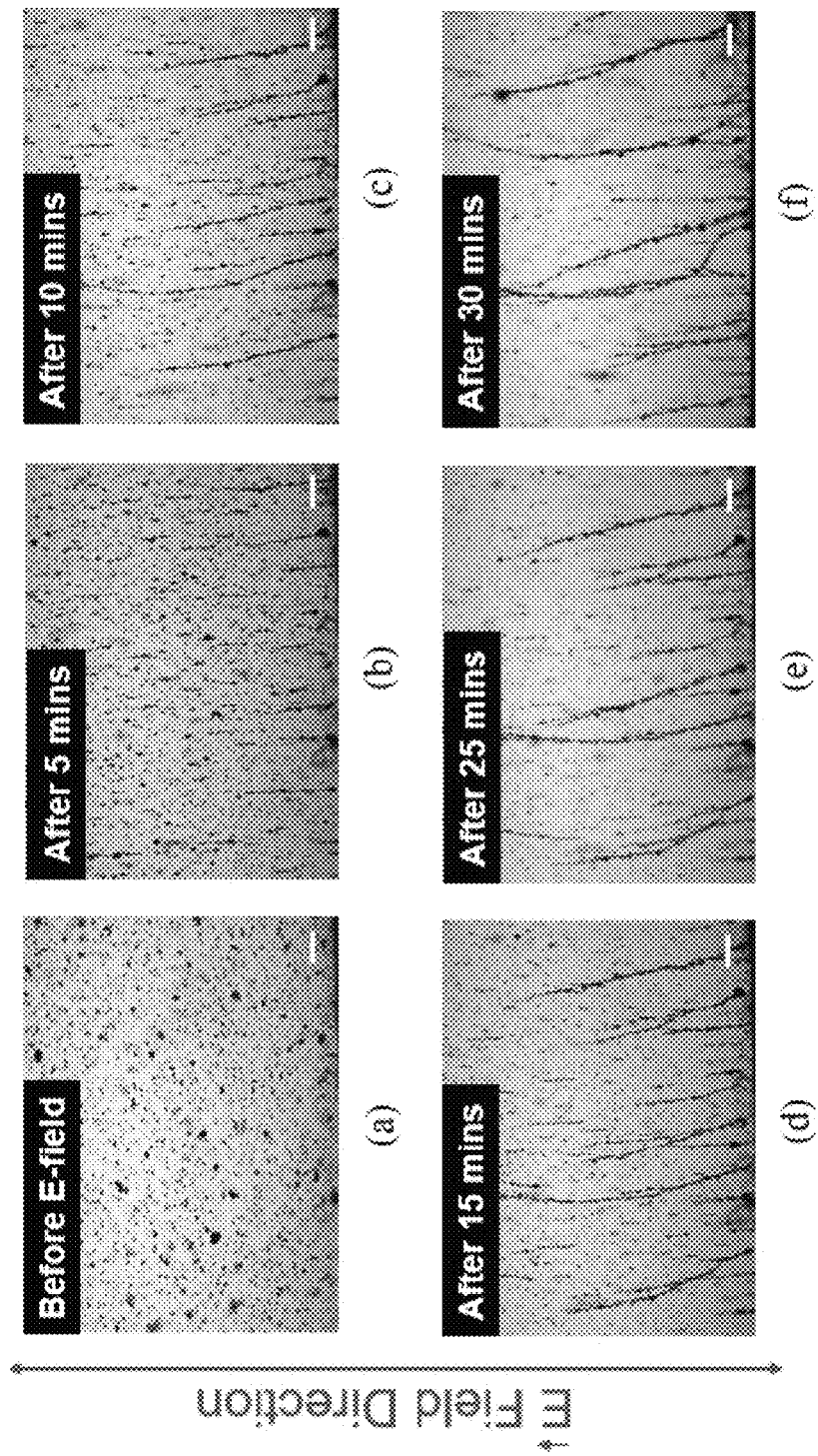
FIG. 12 contains an optical microscope image of a GNPs/PDMS film and shows the progressive formation of GNPs columns in the thickness (z) direction of the film during electric field alignment.

FIGS. 6 and 12 contain optical microscope images that show the real-time alignment of particles in PZT/GNPs/PDMS and GNPs/PDMS films during the application of a uniform electric field, respectively. FIG. 12 shows the formation of GNPs columns in the thickness direction during electric field alignment using an electric field strength of 1000 V/mm (scale bar: 100 μm). Image (a) was taken before the application of the electric field, and images (b), (c), (d), (e), and (f) show alignment progression after 5, 10, 15, 25, and 35 minutes of electric field application. Images (i), (ii), (iii), (iv), (v), and (vi) of FIG. 6 show alignment progression in the PZT/GNPs/PDMS film for the same points in time when subjected to the same electric field strength. As clearly seen, the degree of alignment of particles in both systems increased over time.

Figure 13:
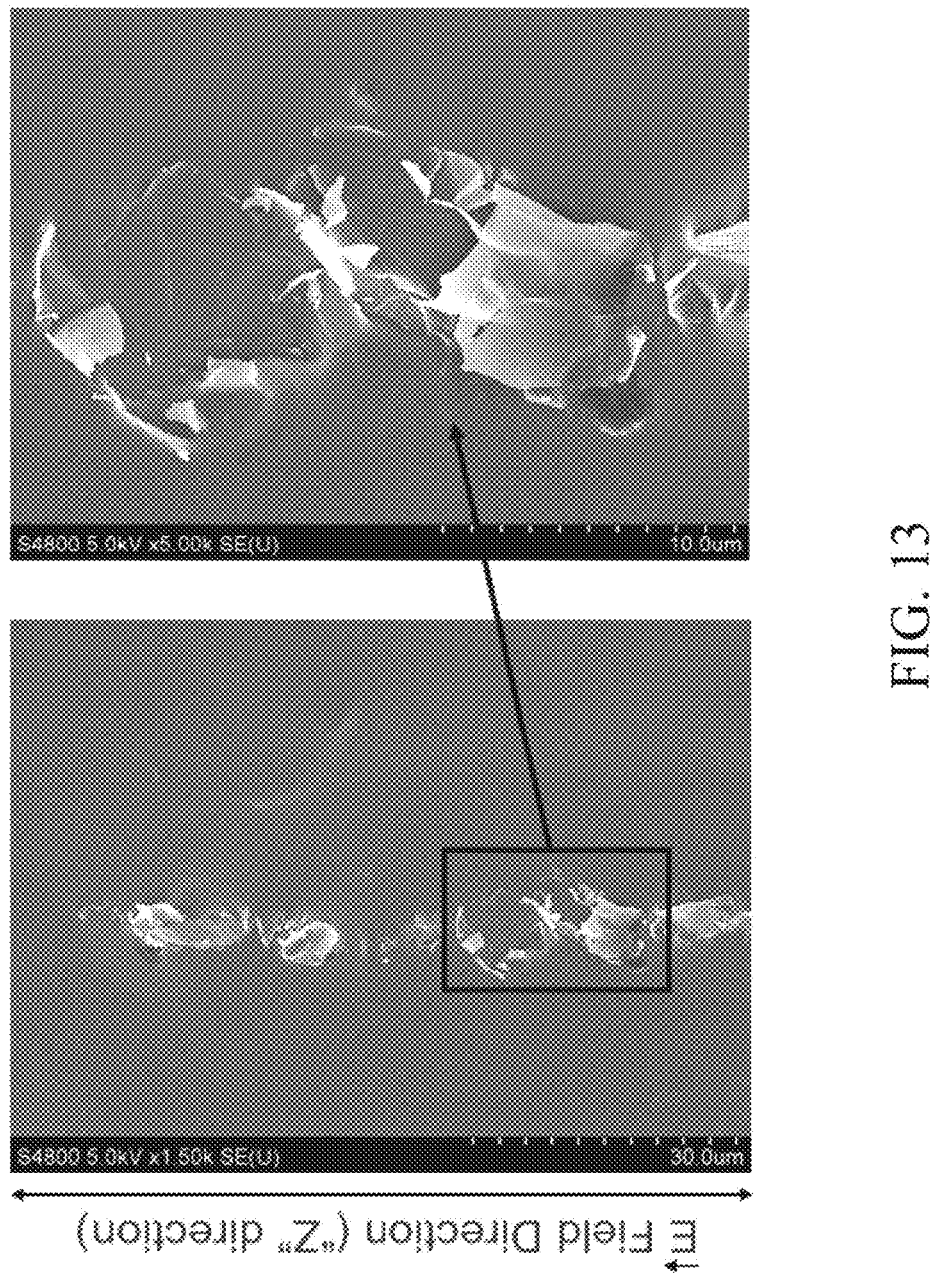
FIGS. 13 and 14 contain cross-sectional SEM images of, respectively, GNPs/PDMS and PZT/GNPs/PDMS films and reveal how the PZT particles and GNPs interacted with each other during electric field-induced alignment.
Figure 14:
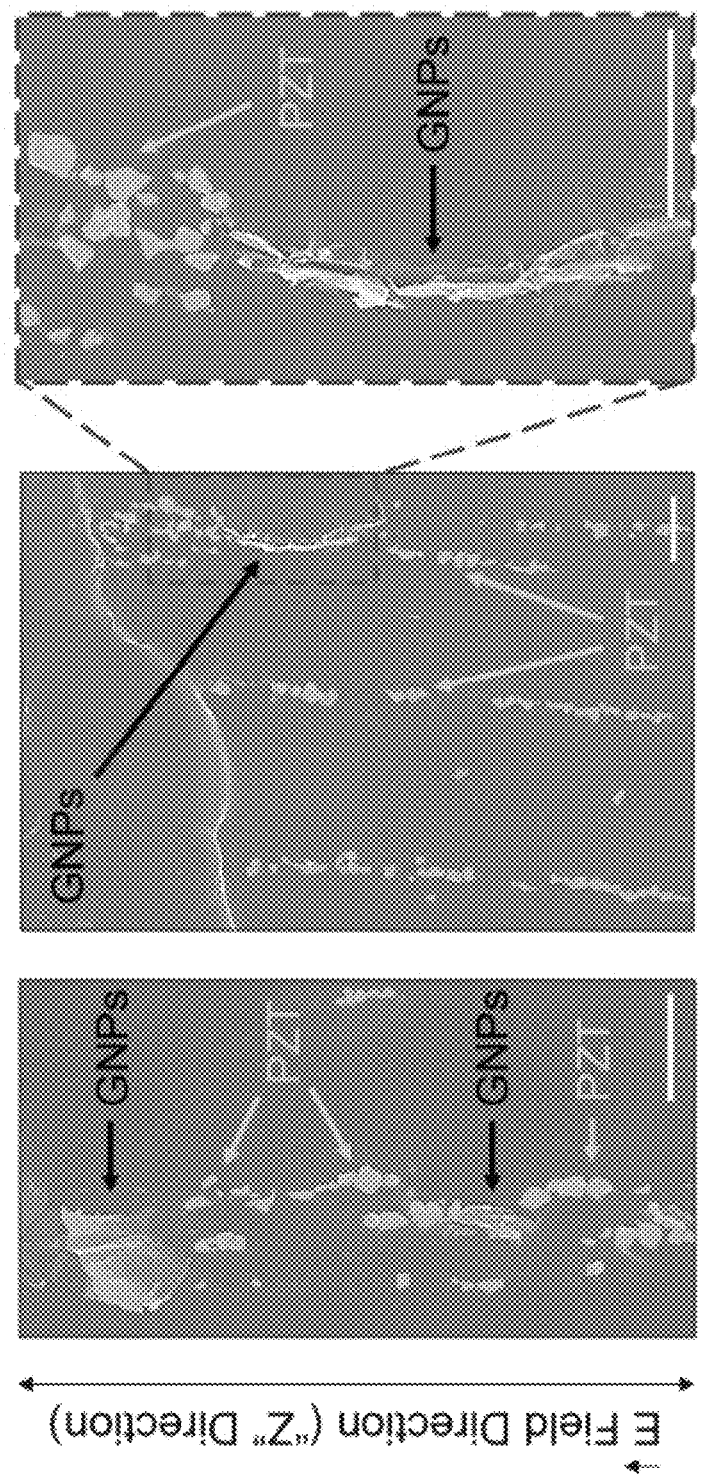
Figure 15:
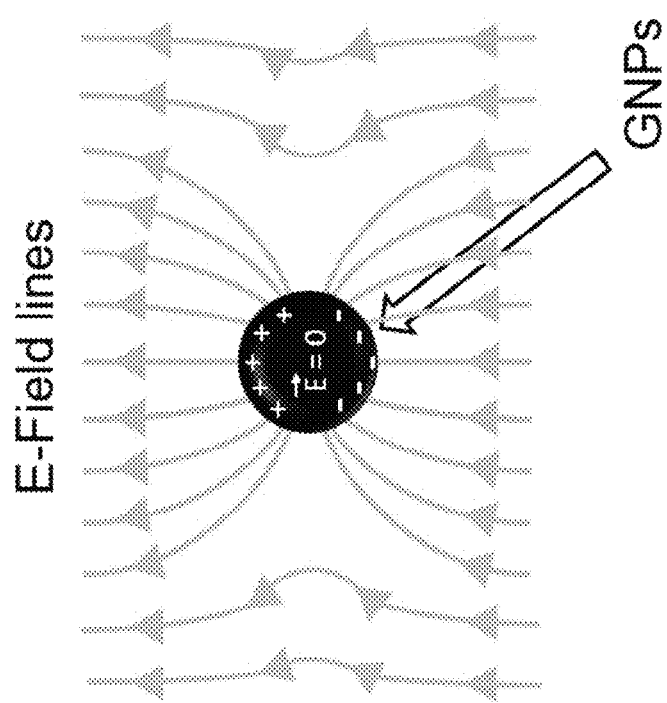
FIG. 15 schematically represents electric field lines around an electrically conducting particle when placed in a uniform external electric field.

FIGS. 13 and 14 contain cross-sectional SEM images of GNPs/PDMS and PZT/GNPs/PDMS films, respectively, and reveal how the PZT particles and GNPs interacted with each other during the electric field-induced alignment. The scale bars in FIG. 14 are 10 μm. As shown in FIG. 14, during alignment the PZT columns formed around the GNPs similar to electric field lines around an electrically conducting particle when placed in a uniform external electric field, schematically represented in FIG. 15. The GNPs are conducting and facilitate the charge transport in the film, hence increasing the sensitivity and nanogenerator capabilities of the piezoelectric films.

Figure 17:
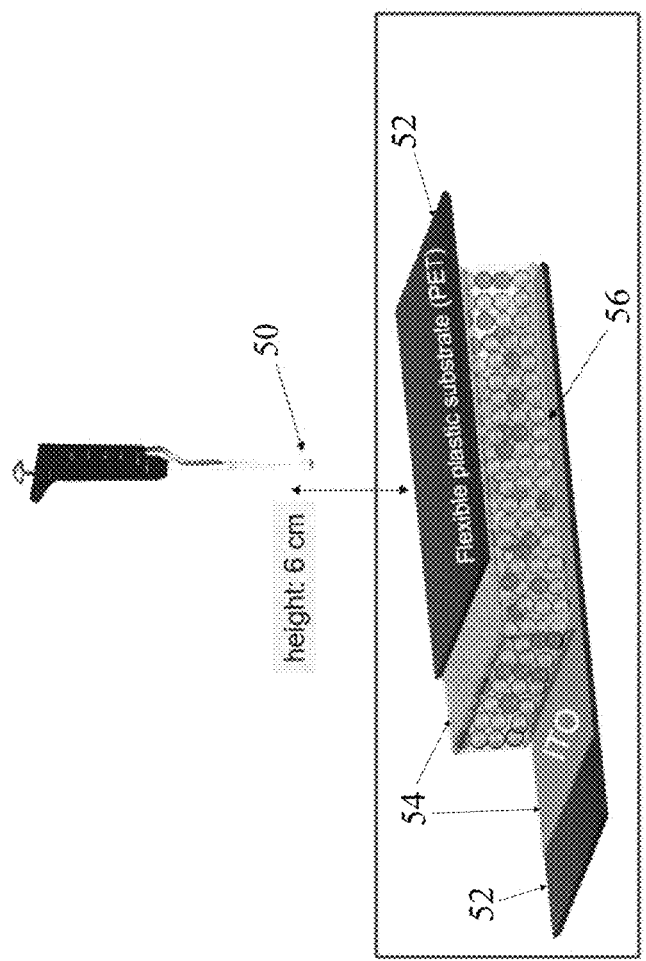
FIG. 17 contains a schematic representation of an experimental set-up of a water drop test.

Further investigations were then conducted to evaluate the piezoelectric responses of PZT/PDMS-based and PZT/GNP/PDMS-based piezoelectric films that had undergone electric field alignment for different periods of time. Devices were produced by laminating cured piezoelectric films between two ITO-coated PET electrodes. For comparison, devices were also fabricated from films that lacked PZT particles and GNPs ("Neat PDMS") but were otherwise identical to the PZT/PDMS-based and PZT/GNP/PDMS-based piezoelectric films. The length, width and thickness dimensions of the devices were 2.5 cm, 1.5 cm, and 150 μm, respectively. Electrical contacts are established with copper tapes and silver paste. The piezoelectric responses of the sample devices were evaluated by measuring the voltage output when different sizes of water droplets (5 μL, 10 μL, 20 μL, 30 μL) were dropped onto the devices from a constant height of 6 cm. The experimental setup is represented in FIG. 17. The schematic includes a water droplet 50, flexible and transparent plastic substrate (PET) 52, transparent ITO coating 54, and aligned PZT particles and GNPs 56.

Figure 19:
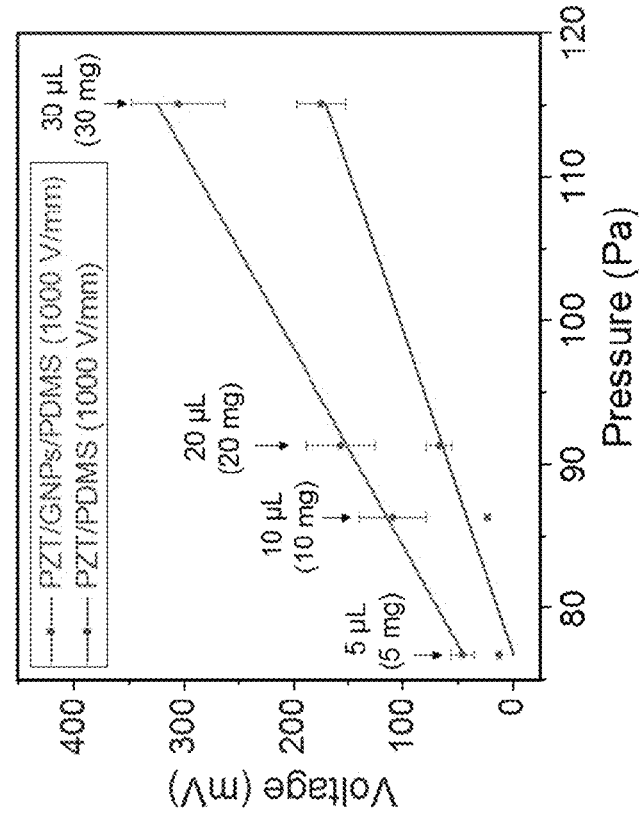
FIG. 19 is a graph evidencing the effect of graphene nanoparticles on voltage generation in a PZT/GNP/PDMS-based device.
Figure 18:
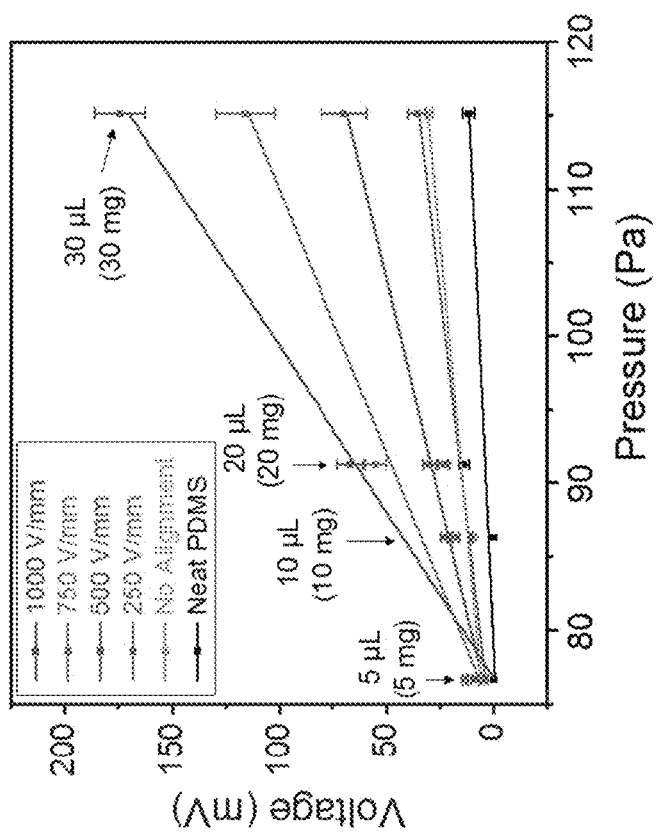
FIG. 18 plots the voltage level generated by PZT/PDMS-based devices relative to the size of droplets impacting the devices.

FIGS. 18 and 19 plot levels of voltage generated for the PZT/PDMS and PZT/GNPs/PDMS-based devices relative to droplet size, respectively. FIGS. 18 and 19 also indicate the calculated impact pressure values of the water droplets on the devices. An oscilloscope was used during the measurements with an input resistance of 10 MΩ. The highest voltage generations were obtained from the device that had been aligned under the highest field strength (1000 V/mm). This result indicated the importance of field strength on the alignment of PZT particles, and hence the piezoelectric response. It can clearly be seen from FIG. 18 that the voltage generation increased with increasing droplet size and approached 175 mV when the 30 μL droplet was delivered.

The voltage outputs that were obtained under the same conditions with the PZT/GNP/PDMS-based devices were dramatically higher. FIG. 19 clearly shows the effect of the graphene nanoparticles on voltage generation. For the 30 μL droplet size, the voltage generation approached 300 mV, compared to 175 mV for the PZT/PDMS-based devices. These results evidenced the outstanding capability of PZT/GNPs/PDMS systems in terms of converting mechanical energy into electrical energy. In comparison, prior investigations reported similar voltage levels as requiring finger pressure of about 2 kPa, much higher than the approximately 115 Pa impact of a water droplet, using piezoelectric nanogenerators based on PZT nanofibers.

Figure 21:
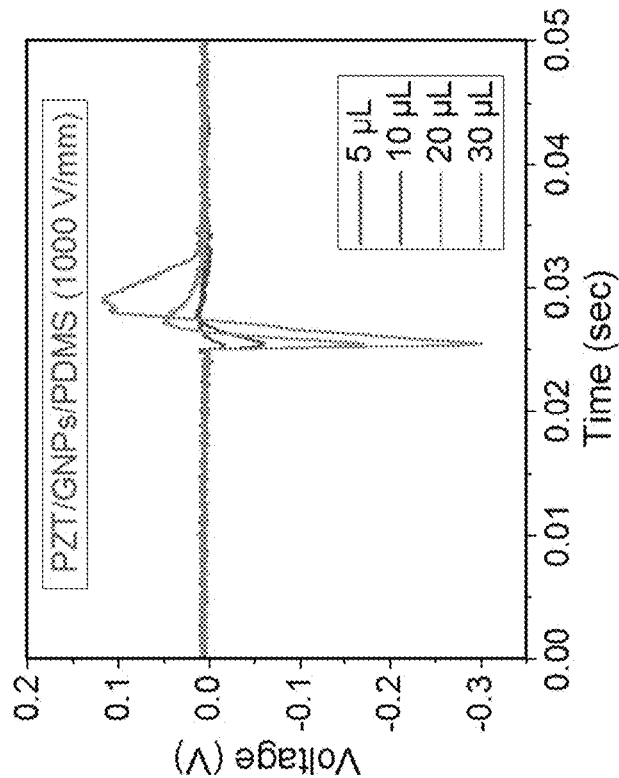
FIGS. 20 and 21 show oscilloscope outputs for different water droplet sizes when delivered onto PZT/PDMS and PZT/GNPs/PDMS-based devices, respectively.
Figure 20:
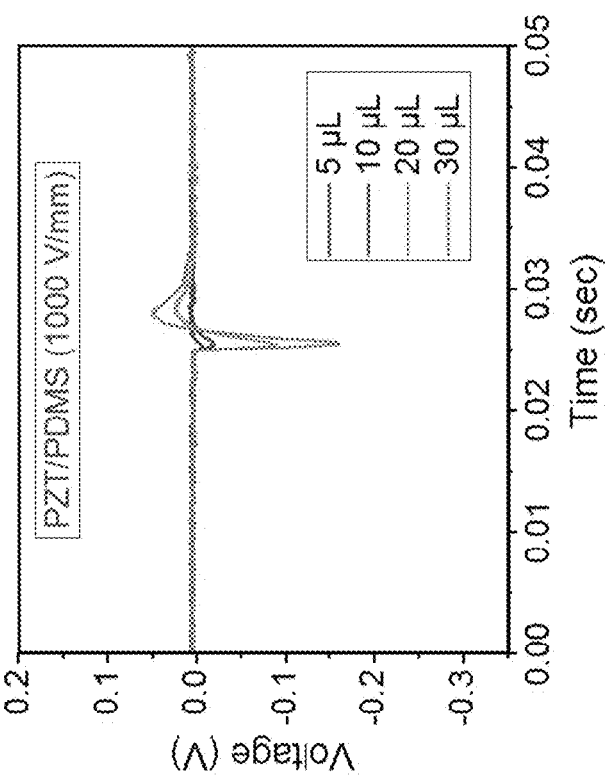
Figure 22:
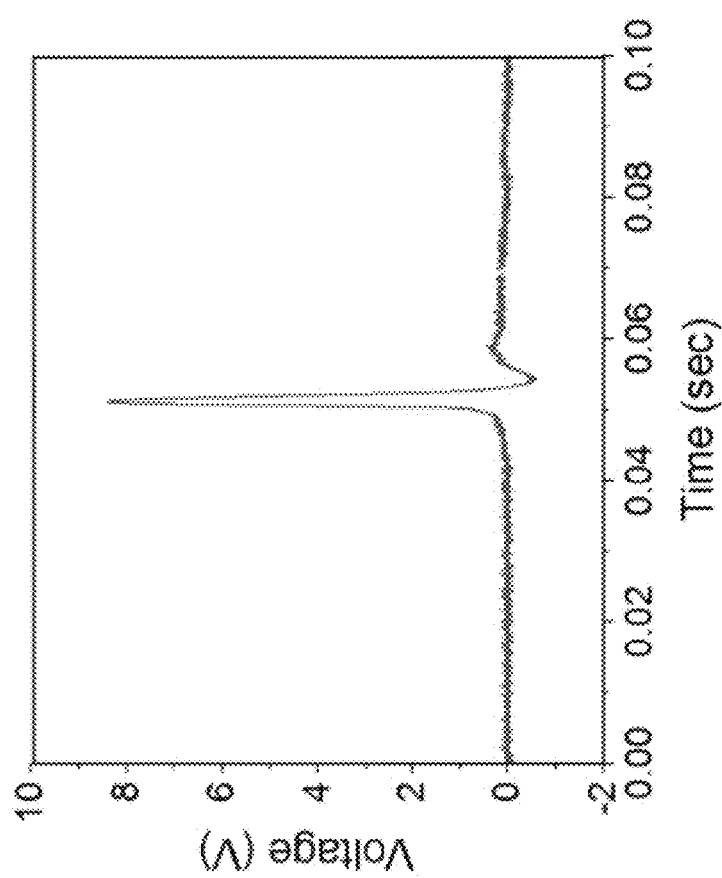
FIG. 22 shows oscilloscope outputs of a PZT/GNPs/PDMS-based device when subjected to the touch of a finger.

To further demonstrate the effect of GNPs, FIGS. 20 and 21 show oscilloscope outputs for different water droplet sizes when delivered onto the PZT/PDMS and PZT/GNPs/PDMS-based devices, respectively, whose data were plotted in FIG. 19. For comparison, FIG. 22 plots the oscilloscope output of the PZT/GNPs/PDMS-based device when subjected to the touch of a finger. The highest voltage output observed for PZT/GNPs/PDMS film was about 8.2 V. In the case of a similar device produced from 5 μm-thick films of FIG. 8, a 5.24 V voltage output was observed during a comparable finger touch experiment.

Besides their energy harvesting capabilities in response to mechanical deformations, the electric field-aligned PZT/GNPs/PDMS samples were also capable of sensing very small pressures. To demonstrate the outstanding pressure sensing features of the PZT/GNPs/PDMS devices, a bird feather (6.8 mg) was used as a load on a sample of a PZT/GNPs/PDMS-based device. When the bird feather was dropped onto the surface, an approximately 20 mV peak-to-peak voltage output was observed over a 20-millisecond range. The PZT/GNPs/PDMS-based devices were demonstrated as capable of sensing much smaller loads (a piece of a bird feather with a weight of 1.4 mg) at very fast response times.

Figure 23:
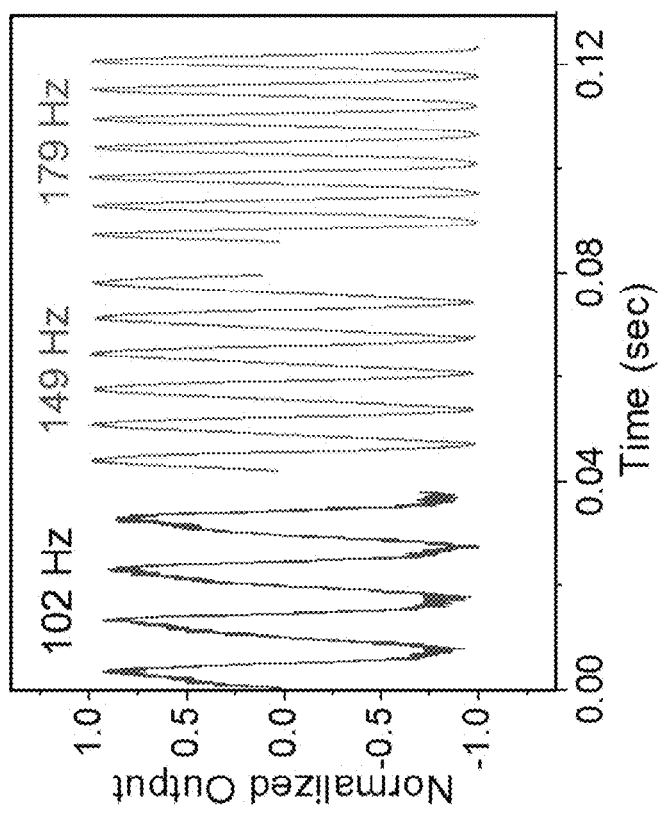
FIG. 23 contains a graph showing normalized outputs at different mechanical vibration frequencies (film dimension: 2.5 cm×1.5 cm×150 μm).

To demonstrate that the PZT/GNPs/PDMS samples were capable of detecting vibrations, a small vibration motor was attached on a plastic cantilever and connected to a power supply to deliver loads to the samples at different frequencies. The normalized output is shown in FIG. 23. The voltage output was normalized to remove amplitude variations caused by the frequency dependence of both the mechanical impedance of the cantilever and vibratory motor output (normal for all mechanical transducers and couplers). This experiment showed that the films were able to reproduce vibratory inputs at different frequencies as low as 102 Hz.

Figure 24:
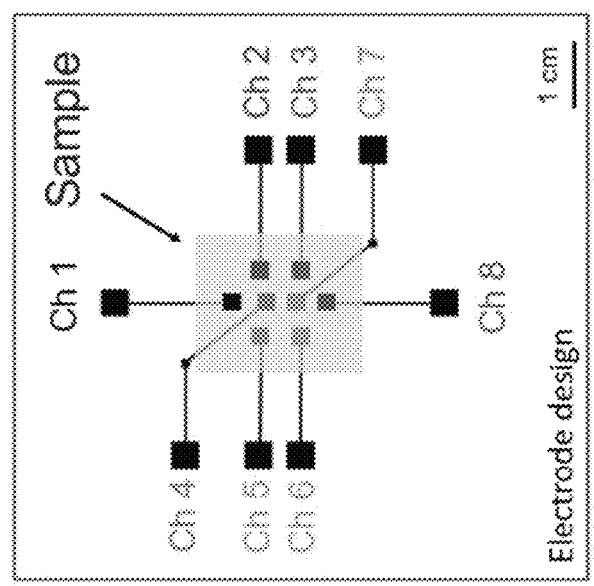
FIG. 24 contains a schematic representation of inkjet-printed silver electrodes located on the film.
Figure 25:
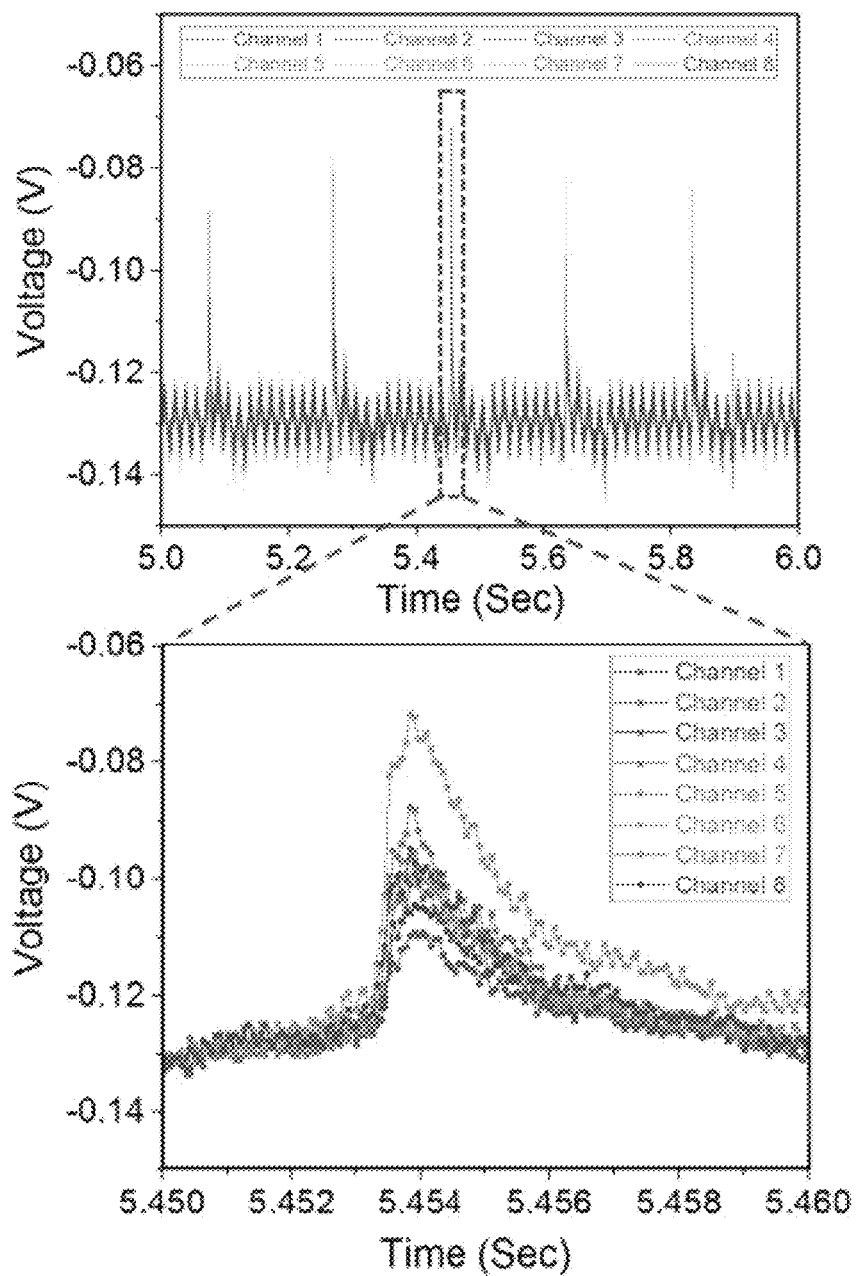
FIG. 25 contains graphs representing an output voltage versus time plot. The magnified view shows the variations in voltage generation (due to non-uniform pressure distribution) obtained from each individual electrode.
Figure 26:
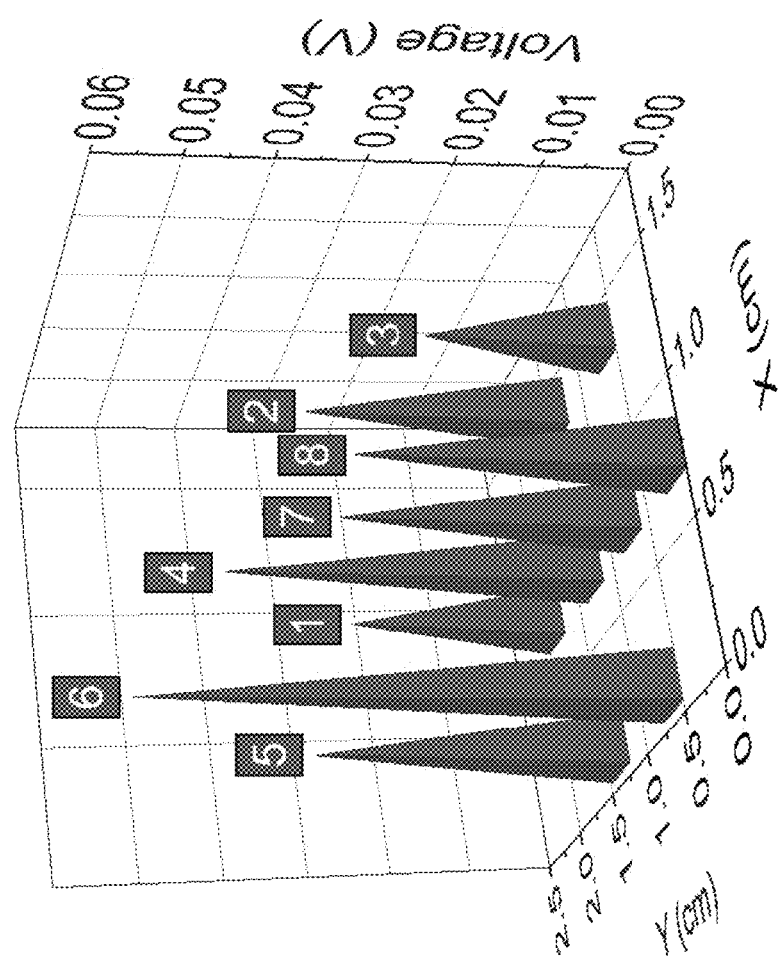
FIG. 26 contains a three-dimensional plot representing exact locations of each electrode along with the corresponding generated output voltage.

To demonstrate the pressure mapping capability of this anisotropic piezoelectric film, silver ink electrodes (0.25 cm×0.25 cm) were applied at eight different positions on a transparent PET substrate. The top electrode was ITO-coated PET, with a total thickness of 175 μm. The aligned PZT/GNPs/PDMS film was sandwiched between the top and bottom electrodes. This experimental set-up is shown in a schematic representation in FIG. 24. For calibration, a 20 g weight was dropped on each electrode pad one at a time from a certain distance to determine the response levels. A finger tap on the sample illustrated the effectiveness of the mapping process. Different voltage values were recorded for each electrode representing pressure variations caused by the nonuniform forces exerted by the fingertip due to its geometry (FIG. 25). Most of the pressure was delivered on electrode 6 since it had shown the highest signal, while the electrodes next to it (e.g., 7 and 8) exhibited relatively low signals. The electrodes far from electrode 6, such as electrodes 1 and 3, had the lowest pulse values (FIG. 26).

The promising high-tech future of the "Internet of Things" (IoT) and flexible electronics cannot be fully achieved without the availability of self-powered electronics and sensors. For this purpose, a great deal of research has been focused on the development of nano and macro-sized energy harvesters and sensors. To date suggested methods for production of highly efficient nanogenerators and sensors have been limited in terms of flexibility, transparency, sensitivity, and performance of the devices. As reported herein, high-performance PZT/GNP/PDMS devices were produced that were flexible and transparent, and shown to be well suited for use in piezoelectric nanogenerators and pressure sensors. With the electric field alignment method described above, the quantity of particles required to develop a piezoelectric effect was greatly reduced. As a result, transparency can be maintained for certain applications, for example, touchscreen interfaces, display panels, and electronic skin for soft robotics. The electric field-induced alignment of PZT particles along with conductive graphitic nanoparticles (graphene nanoplatelets) were shown to facilitate charge transport. As revealed by the SEM images, this preferential alignment in thickness direction gave rise to a unique structure where the pattern of the PZT chains around the GNPs are similar to those electric field lines around an electrically conducting particle when placed in a uniform external electric field.

Figure 27:
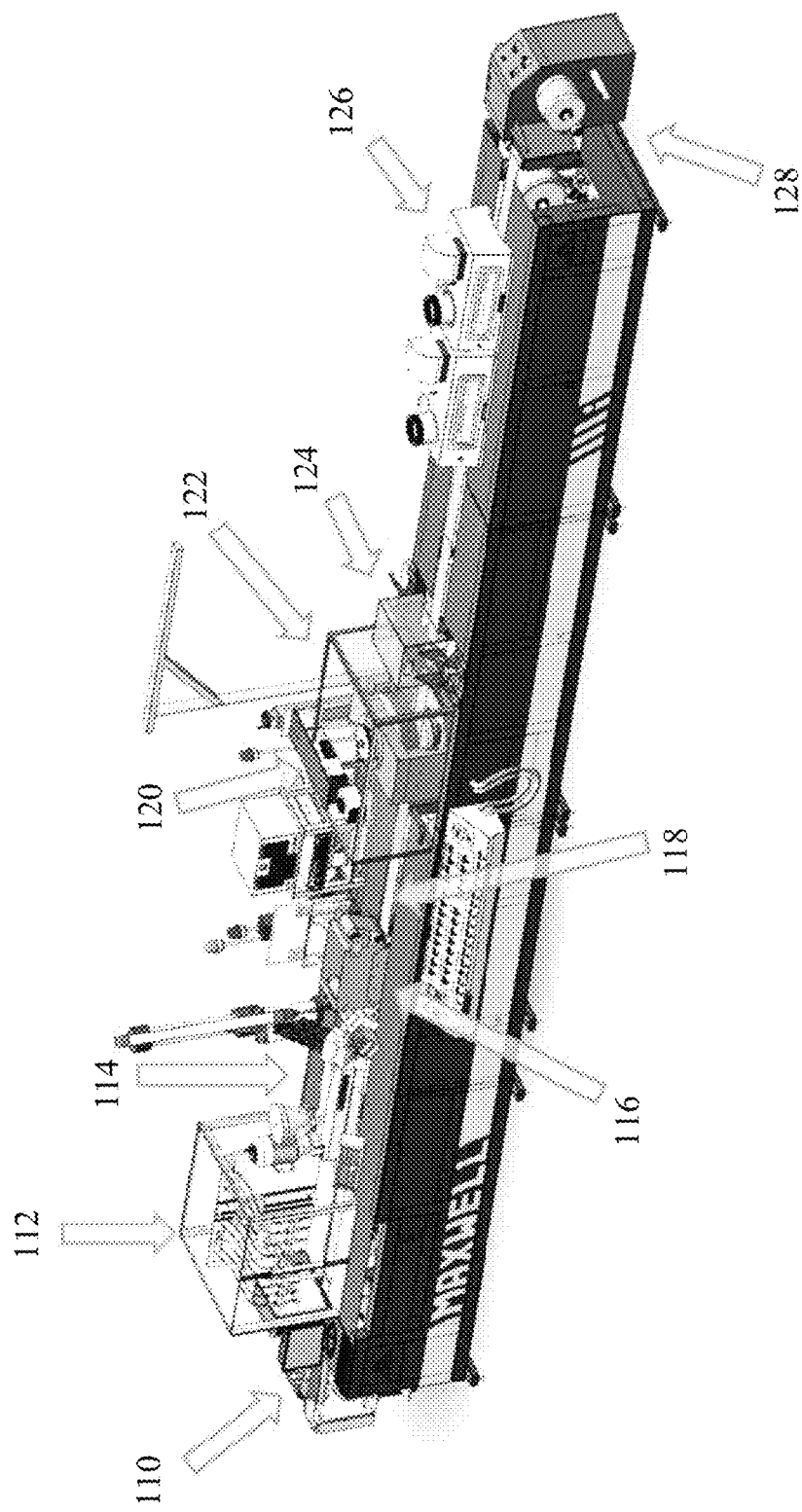
FIG. 27 contains a schematic representation of a nonlimiting example of a roll-to-roll continuous multi-functional film manufacturing line capable of producing PZT/GNPs/PDMS-based piezoelectric nanogenerators.

PZT/GNPs/PDMS-based piezoelectric nanogenerators and other piezoelectric polymer composite films configured as described above can be fully compatible with a continuous large-scale roll-to-roll (R2R) production line that is capable of increasing the size and number of devices that can be produced in a given time period while reducing material costs as compared to traditional batch methods. A nonlimiting example of a particular roll-to-roll continuous machine capable of producing piezoelectric polymer composite films is disclosed in International Publication WO2018/081357, whose contents are incorporated herein by reference. FIG. 27 schematically represents a nonlimiting example of a roll-to-roll multi-functional film manufacturing line disclosed in International Publication WO2018/081357, and depicts the manufacturing line as comprising various processing zones including but not limited to: an unwinding and solution casting zone 110, an electrospinning zone 112, a melt casting zone 114, an electric field (E-field) alignment zone 116, heating plates 118, a laser heating zone 120, a magnetic field alignment zone 122, an ultraviolet (UV) curing zone 124, a heating oven zone 126, and a rewind station zone 128.

During production of films with the machine of FIG. 27, a solution was initially cast via a doctor blade on a flexible and transparent substrate (e.g., PET) in the unwinding and solution casting zone where a high precision granite plate was used to level a casting blade. By using the information obtained from FIG. 6 and FIG. 11, the line speed was precisely calculated and adjusted (e.g., 20 mm/min) to allow sufficient time for PZT and graphene particles to align under the electric field zone. The electric field zone included two electrodes; a conductive top electrode (e.g., copper or a transparent ITO-coated PET) and a grounded bottom electrode. The top electrode was connected to a high voltage (HV) amplifier combined with a wavefunction generator and an oscilloscope to generate and monitor the sinusoidal AC waveform and the amplitude of the electric field. Preferably, a 1 mm air gap was provided between the two electrodes by adjusting the digital height controller located on the HV amplifier.

Figure 16:
FIG. 16 contain SEM images obtained from a large-area electric field aligned sample (R2R).
Figure 16:

Individual heating plates were utilized to control the curing process during the electric field alignment, three under the substrate and three on the top copper electrode. Four of the heating plates (two under the substrate and two on the top copper electrode) were maintained at room temperature to avoid any pre-curing of the sample and promote the effectiveness of electric field on formation of nanocolumns, whereas the temperatures of the remaining two heating plates (one under the substrate and one on the top copper electrode) were set to 85° C. to cure and then lock in the aligned column structures before they exit the electric field section. The electric field strength between the two electrodes was set to 1000 V/mm. SEM images (FIG. 16) were taken to verify the alignment.

Disclosed above are approaches to producing high performance, flexible and transparent PZT/Graphene nanoplatelets (GNPs)/PDMS (polydimethylsiloxane) based piezoelectric nanogenerators and a highly sensitive pressure sensor where PZT particles and GNPs were aligned under an AC electric field in the thickness direction. With the electric field alignment method described, the amount of particles required to develop a piezoelectric polymer composite was greatly reduced relative to conventional methods. As a result, transparency was maintained for desired applications such as touch screen interfaces. Moreover, this approach provides for alignment of PZT particles along with conductive graphitic nanoparticles (i.e. graphene nanoplatelets) to facilitate the charge transport in the system. As revealed by SEM images, this preferential alignment in the thickness direction gives rise to patterns of the PZT chains around the GNPs that are similar to the electric field lines around an electrically conducting particle placed in a uniform external electric field.

Figure 28A:
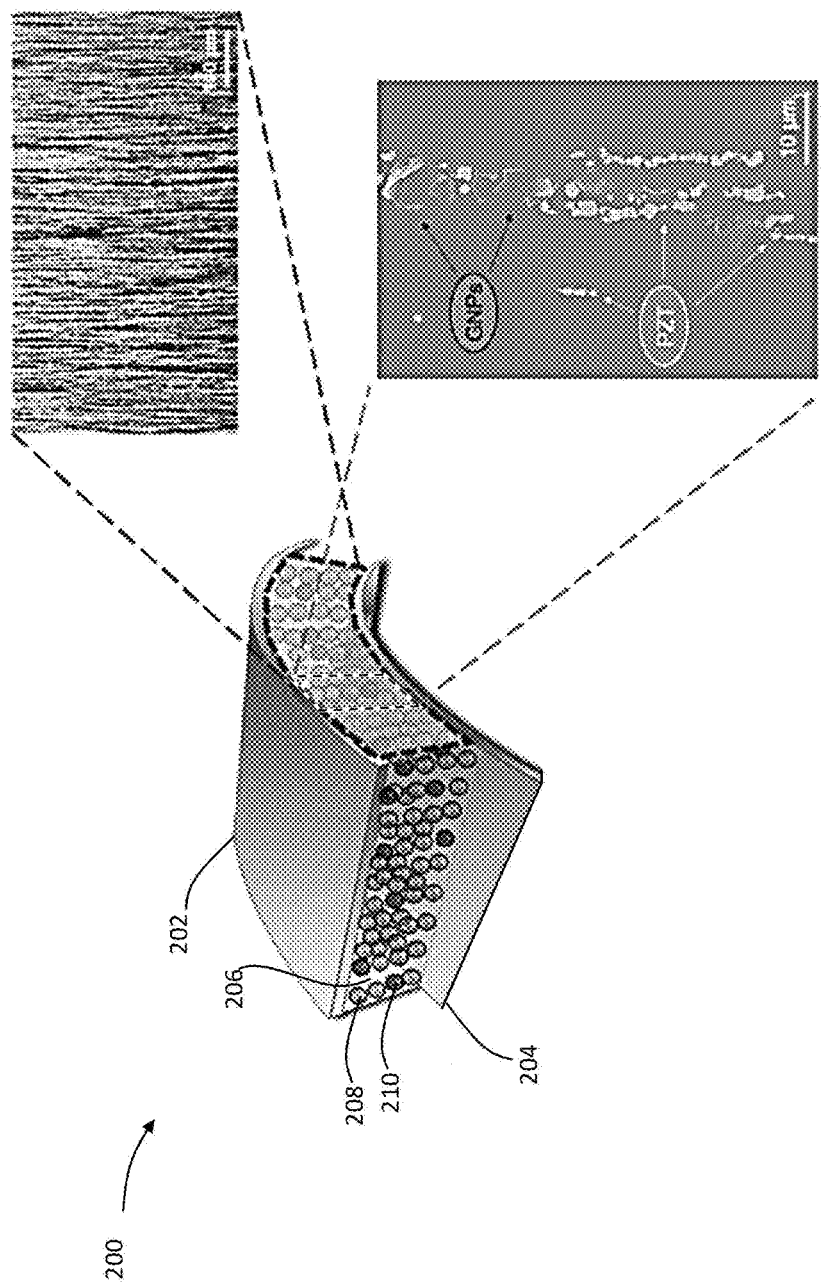
FIG. 28A is a schematic of a transducer disclosed herein including electrodes and sandwiching a flexible substrate embedded therewith lead zirconate titanate (PZT) particles mixed with graphene nanoplatelets (GNPs) particles that are aligned along a first direction by the use of an electric field that can provide extraordinary amount of flexibility and that can be scalable to large arbitrary sizes.

Use of the vertically aligned PZT and graphene nanoplatelets is now described with respect to a transducer. A novel transducer is disclosed herein that can provide extraordinary amount of flexibility and that can be scalable to large arbitrary sizes. An example of this arrangement is shown in FIG. 28A. Referring to FIG. 28A, a transducer 200 according to the present disclosure is shown which can be provided in flat or curved (as shown) configurations. The transducer 200 includes two electrodes 202 and 204. Depending on choice of material of the electrodes 202 and 204, the transducer 200 can be made to be flexible. In addition, depending on the choice of material of the electrodes 202 and 204, the transducer 200 can be made to be translucent or semi-translucent. Examples of electrode material for the electrodes 202 and 204 are Indium Tin Oxide (ITO)-coated Polyethylene Terephthalate (PET) or glass, e.g., WILLOW glass, electrodes. ITO-coated PET films offer high optical transmission and conductivity. For example, THORLABS ITO-coated PET film provide excellent light transmission at a large range of wavelength as provided in FIG. 28D (which provides a graph of transmission as a % vs. wavelength in nm), where light is transmitted at 80% between 600 nm and 2200 nm at an average of about 85%.

The ITO-coated PET film is also highly conductive. Sheet resistance is often used to measure resistance of a large-area conductive electrode. Sheet resistance is defined as resistivity measured in S*m divided by the thickness measured in m. Thus to determine resistance of an electrode, sheet resistance is multiplied by the area of the electrode (i.e., $R=R_s*L/W$, where $R_s$ is sheet resistance and W and L are width and length of the sheet). A common unit for sheet resistance is "ohms square" often shown as Ω-sq, which is dimensionally equivalent to ohm, but is used for sheet resistance to avoid confusion as resistance alone. The ITO-Coated PET of THORLABS, e.g., has a sheet resistance of 350-500 Ω-sq.

The transducer 200 further includes a substrate 206 that can be used to generate a flexible transducer. An example of the substrate 206 is a polydimethylsiloxane (PDMS) matrix, also known as dimethylpolysiloxane—the chemical formula for PDMS is $CH_3[Si(CH_3)_2O]nSi(CH_3)_3$, where n is the number of the repeating aforementioned monomer, i.e., $(SiO(CH_3)_2)$, however, other organic-based silicon polymers are also possible. In general organic-based silicon polymers include carbon-silicon bonds and share common properties.

Figure 28B:
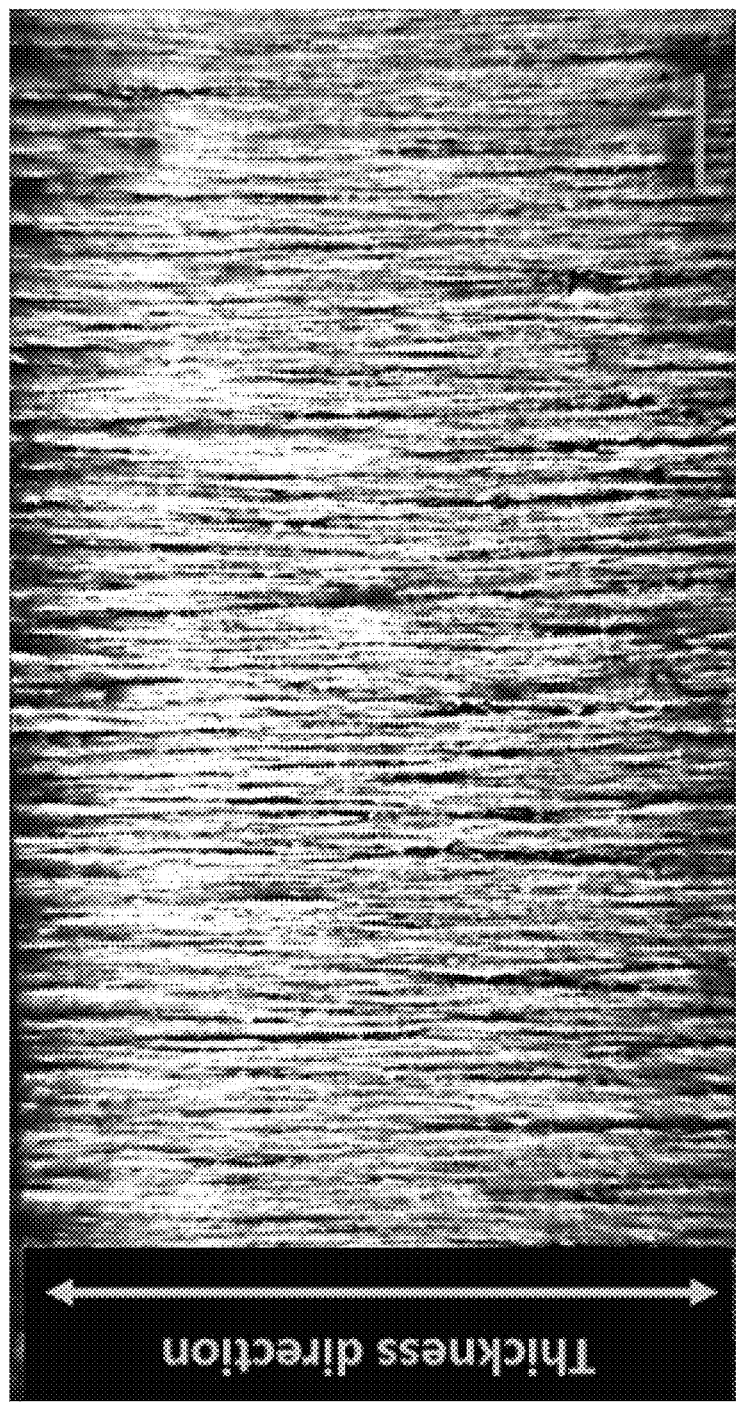
FIG. 28B is a cross-sectional view of the transducer of FIG. 28A.
Figure 28C:
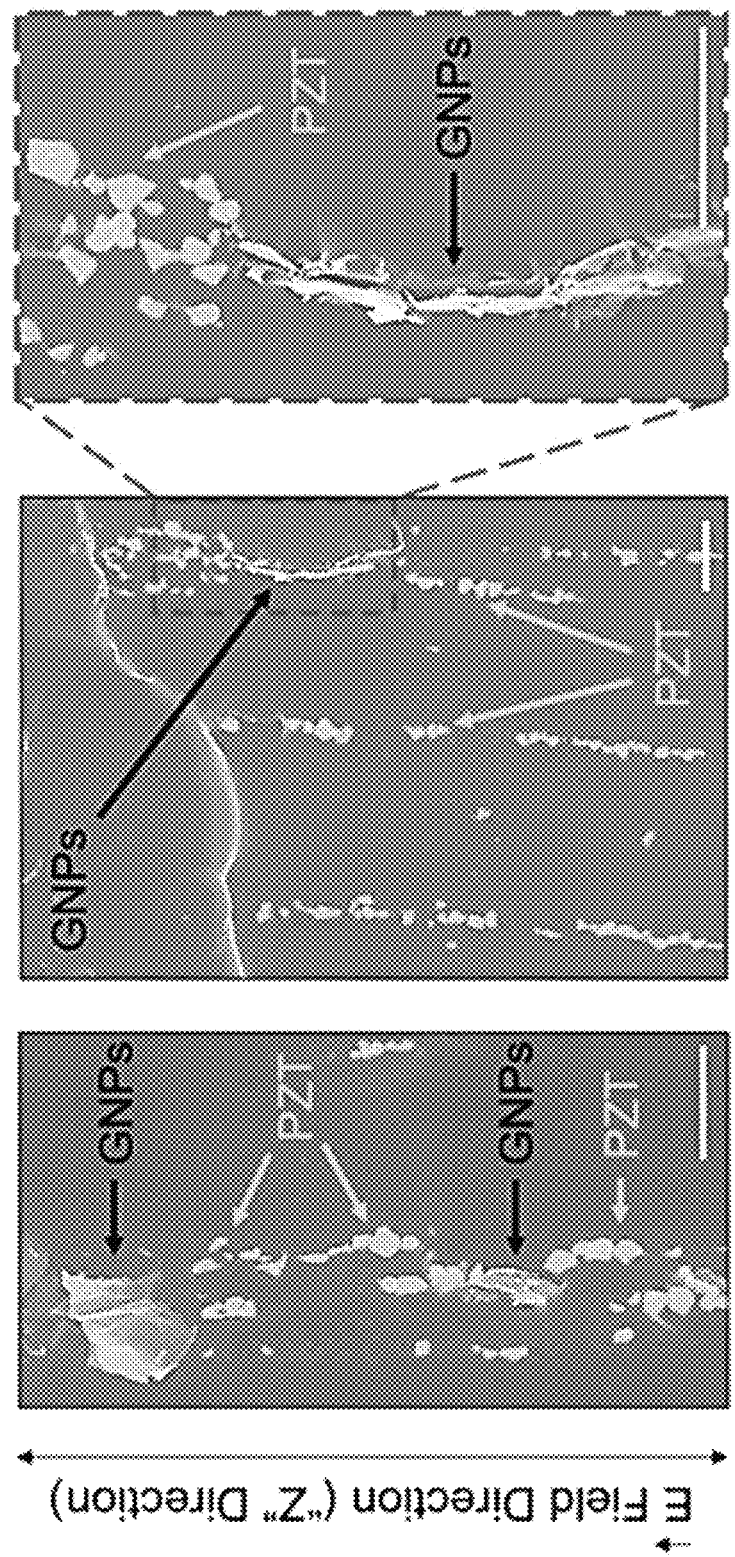
FIG. 28C is a sideview of the transducer pf FIG. 28A showing the transducer in the direction of its thickness.
Figure 28D:
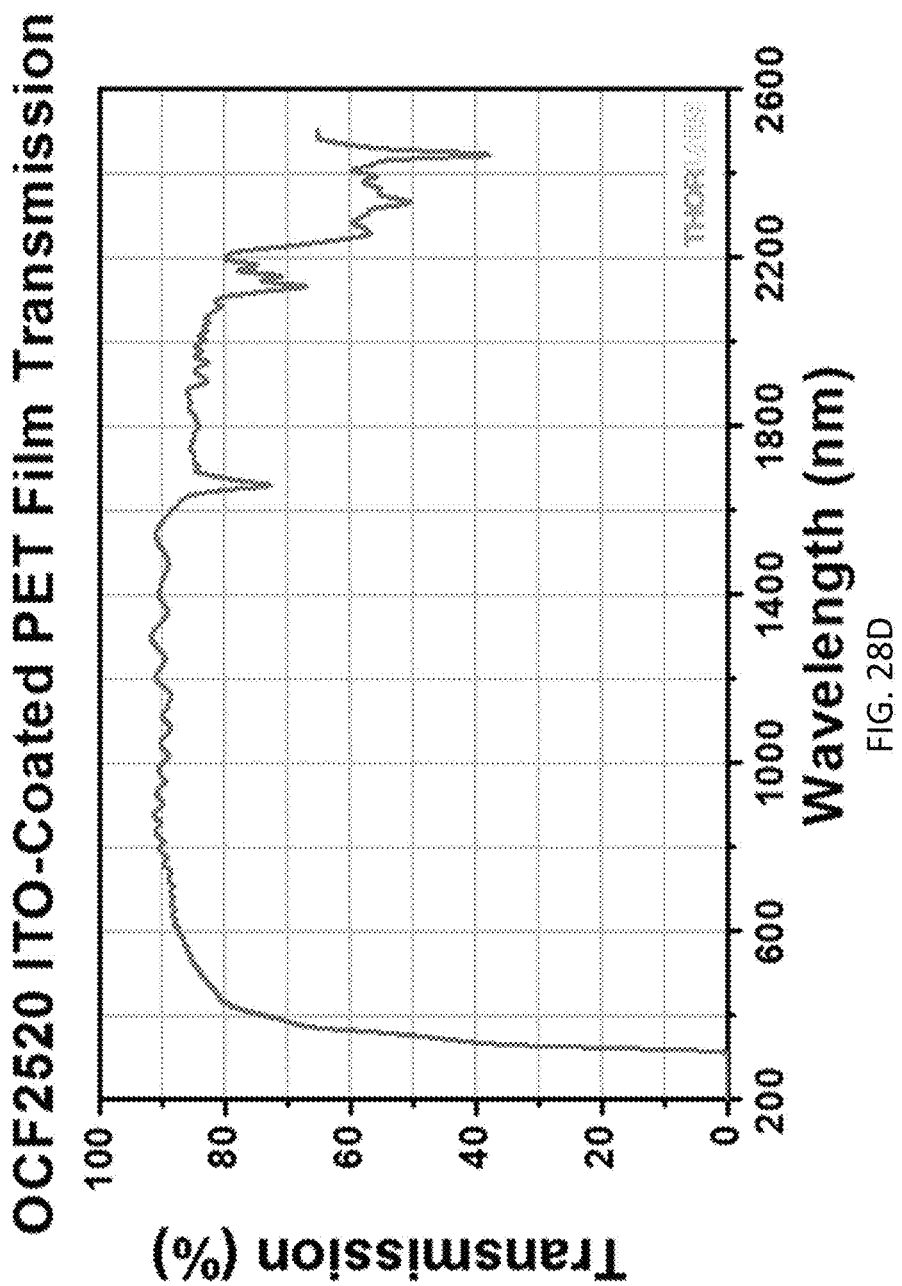
FIG. 28D is a graph of transmission as a % vs. wavelength in nm for light transmission through an Indium Tin Oxide (ITO)-coated Polyethylene Terephthalate (PET) electrode, where light is transmitted at 80% between 600 nm and 2200 nm at an average of about 85%.

The transducer 200 also includes particles embedded in the substrate 206. In particular, the transducer 200 includes lead zirconate titanate (PZT) particles 208 and graphene nanoplatelets (GNPs) 210 embedded in the substrate 206. As discussed in the present disclosure, fabrication of this novel transducer 200 includes application of an electric field to induce alignment of lead PZT particles 208 and GNP particles 210 in the substrate 206. The panels in FIG. 28A are provided in FIGS. 28B and 28C for additional clarity. Referring to FIG. 28B, a cross-sectional view of the transducer 200 within the electrodes 202 and 204 is shown where the embedded PZT and GNPs in PDMS are aligned utilizing an electric field in the Z-direction in the form of towers in the PDMS substrate. By selective application of the electric field (both strength (100 V/mm to 1200 V/mm), duration (10 min to 2 hours or longer—depending on the design of the manufacturing line), and frequency (50 Hz to 10 kHz) a desired alignment of these structures in the form of columns can be arranged in a selective manner. As such, a histogram-like arrangement in a sheet of flexible and optionally translucent substrate can be achieved. FIG. 28C is a sideview of the transducer 200 showing the transducer in the direction of its thickness.

One such use of the transducer 200 is in a loudspeaker (curved or flat; flexible or rigid, opaque to translucent; or combinations thereof). Photographic examples of a loudspeaker according to the transducer 200 can be seen in FIGS. 29A and 29B in which a transparent loudspeaker is shown whereby a piezoelectric PZT/GNPs/PDMS system is provided by the lamination of two ITO-coated PET electrodes. In FIG. 29B, the flexible and transparent speakers are provided utilizing ITO coated PET or WILLOW glass electrodes.

Figure 29A:
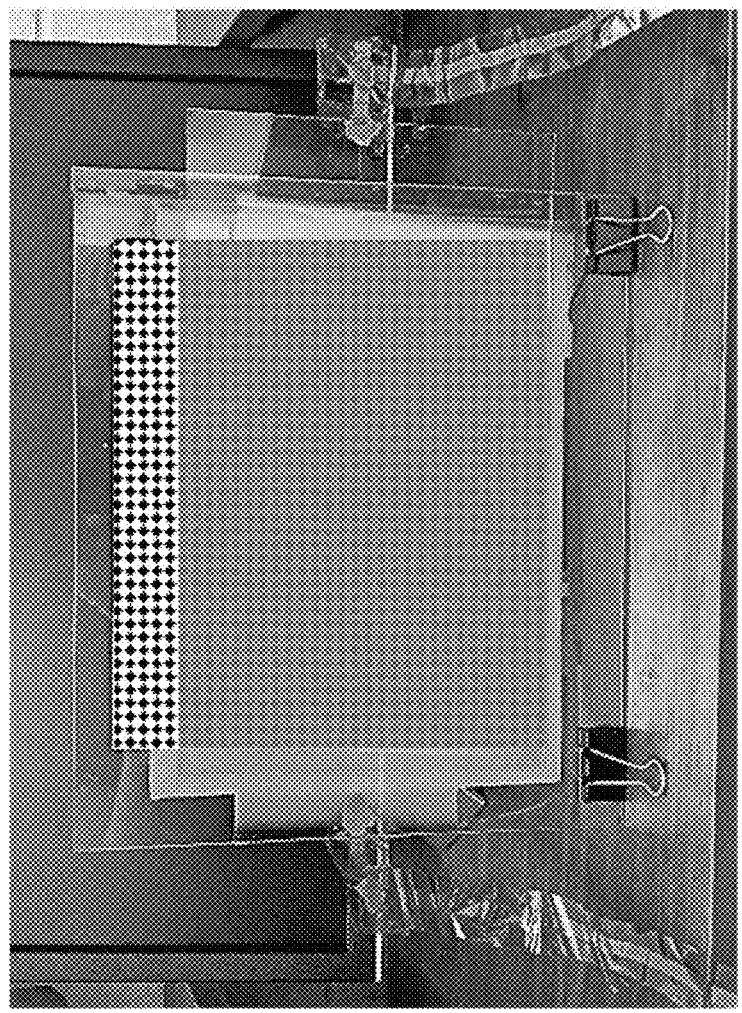
FIG. 29A is a photograph of a transparent loudspeaker whereby a piezoelectric PZT/GNPs/polydimethylsiloxane (PDMS) system is provided by the lamination of two ITO-coated PET electrodes.
Figure 29B:
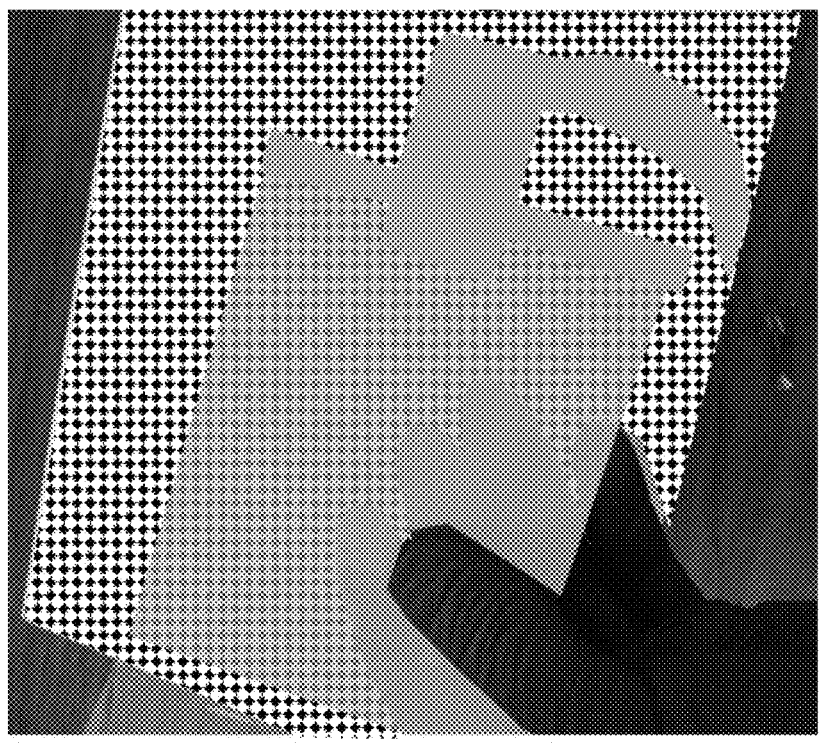
FIG. 29B is a schematic of a flexible and transparent speakers utilizing ITO-coated PET or WILLOW glass electrodes.
Figure 30A:
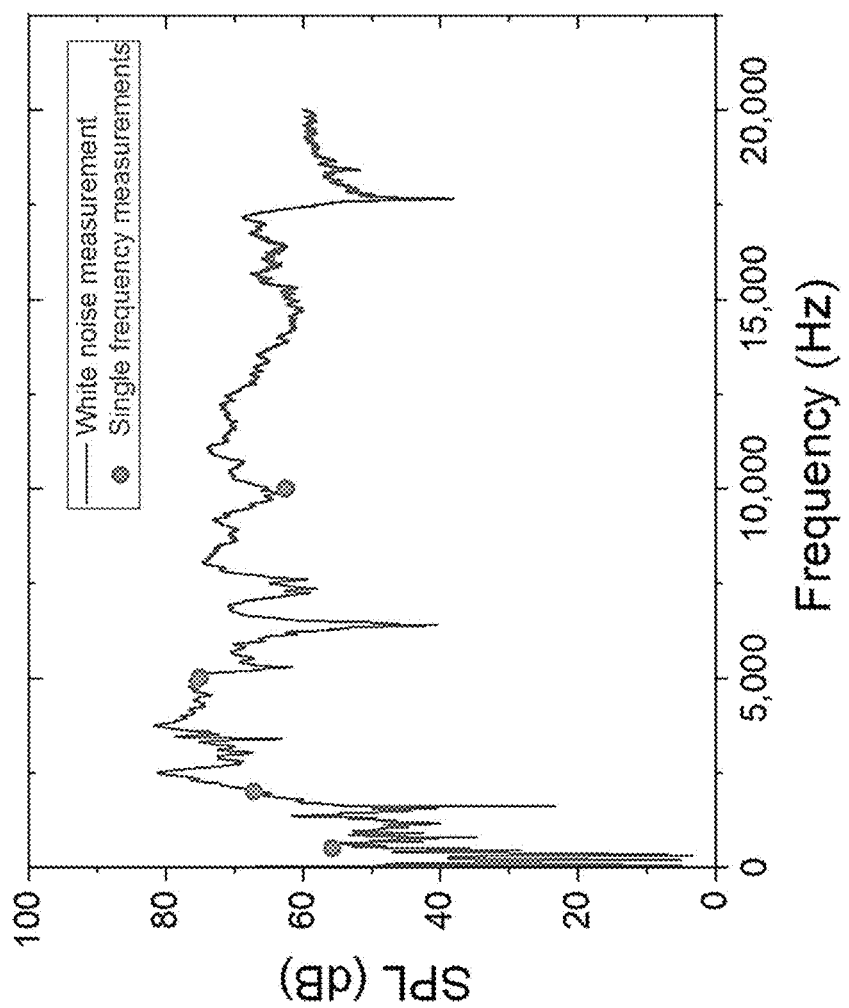
FIG. 30A is a graph of a high-output Sound Pressure Level (SPL) measurements of the loudspeaker over a wide frequency range (0 Hz to 20,000 Hz).
Figure 30B:
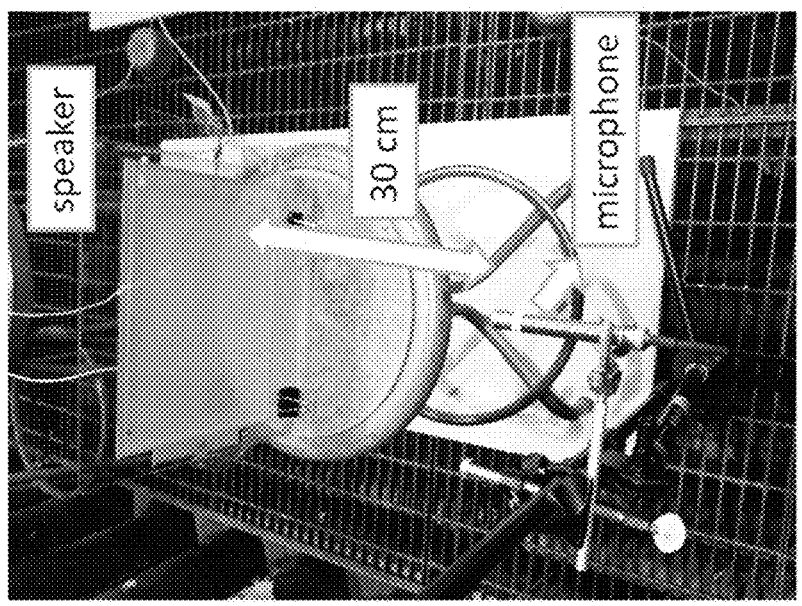
FIG. 30B is a photograph of an experimental setup for measuring sound from the loudspeaker according to the present disclosure.

The speaker shown in FIG. 29A is tested to show their frequency response. A high-output Sound Pressure Level (SPL) measurements of the loudspeaker over a wide frequency range (0 Hz to 20,000 Hz) is shown in FIG. 30A based on a measurements which were carried out in an anechoic chamber where the distance between a microphone and the speaker was kept at 30 cm, as shown in FIG. 30B which is a photographic representation of the test setup of the loudspeakers of FIGS. 29A and 29B. The results provided in FIG. 30A show excellent output for the SPL measurement. These measurements are on par with other technologies where the microphone distance is 3-6 times closer (e.g., 5-12 cm vs. 30 cm as in the present disclosure) producing similar results.

In either of these arrangements (loudspeaker or force sensor), the flexibility of the arrangement can be between 0° and 180°. For example, a rectangular portion having the dimensions 220×100 sq mm can be folded along a line about the middle of the length or width dimension between 0° and 180°.

Figure 31A:
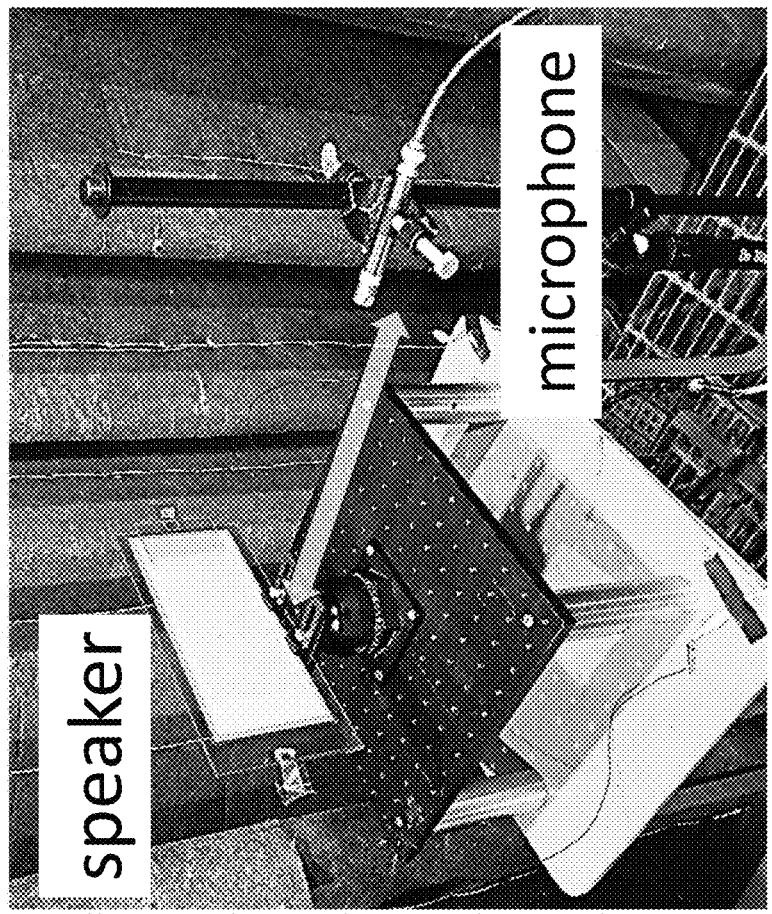
FIGS. 31A and 31B are photographs of another experimental setup according to the present disclosure.
Figure 31B:
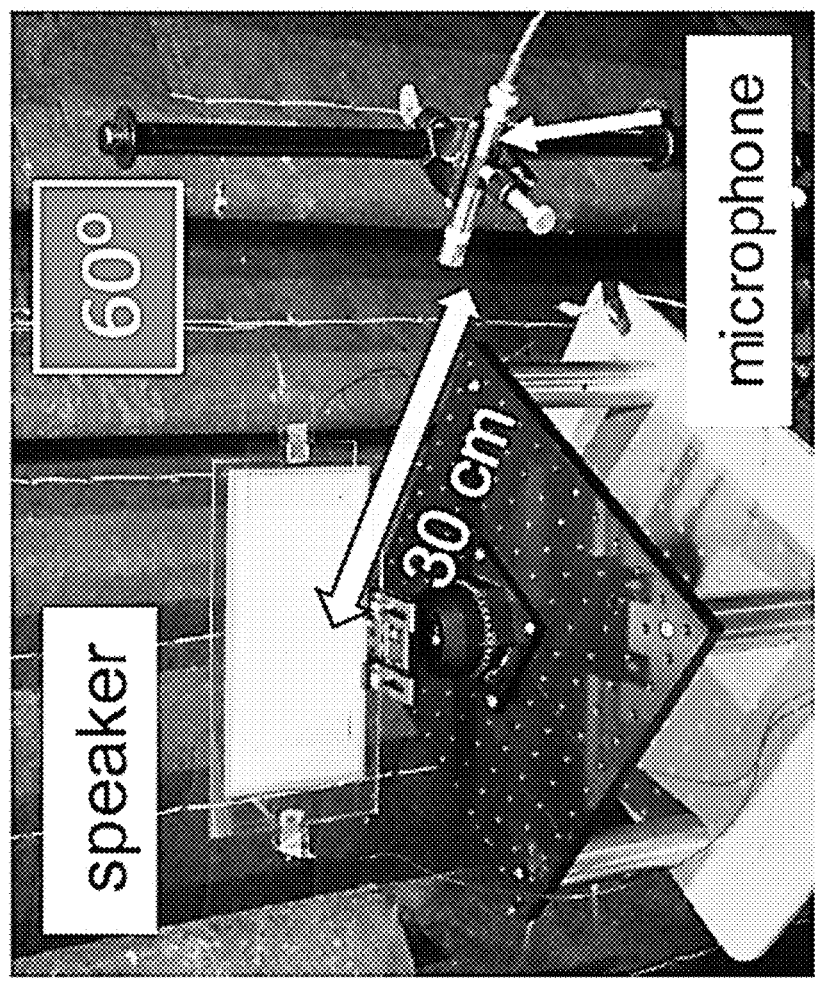
Figure 31C:
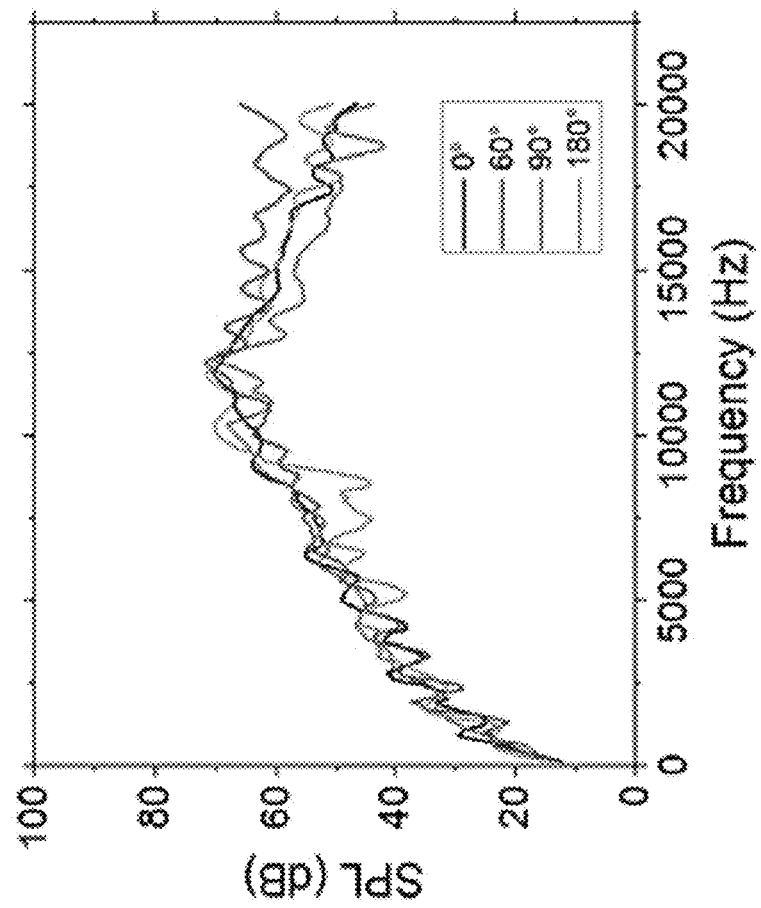
FIG. 31C is a graph of SPL measured in dB vs. frequency measured in Hz showing the result of the loudspeaker according to the present disclosure.
Figure 31D:
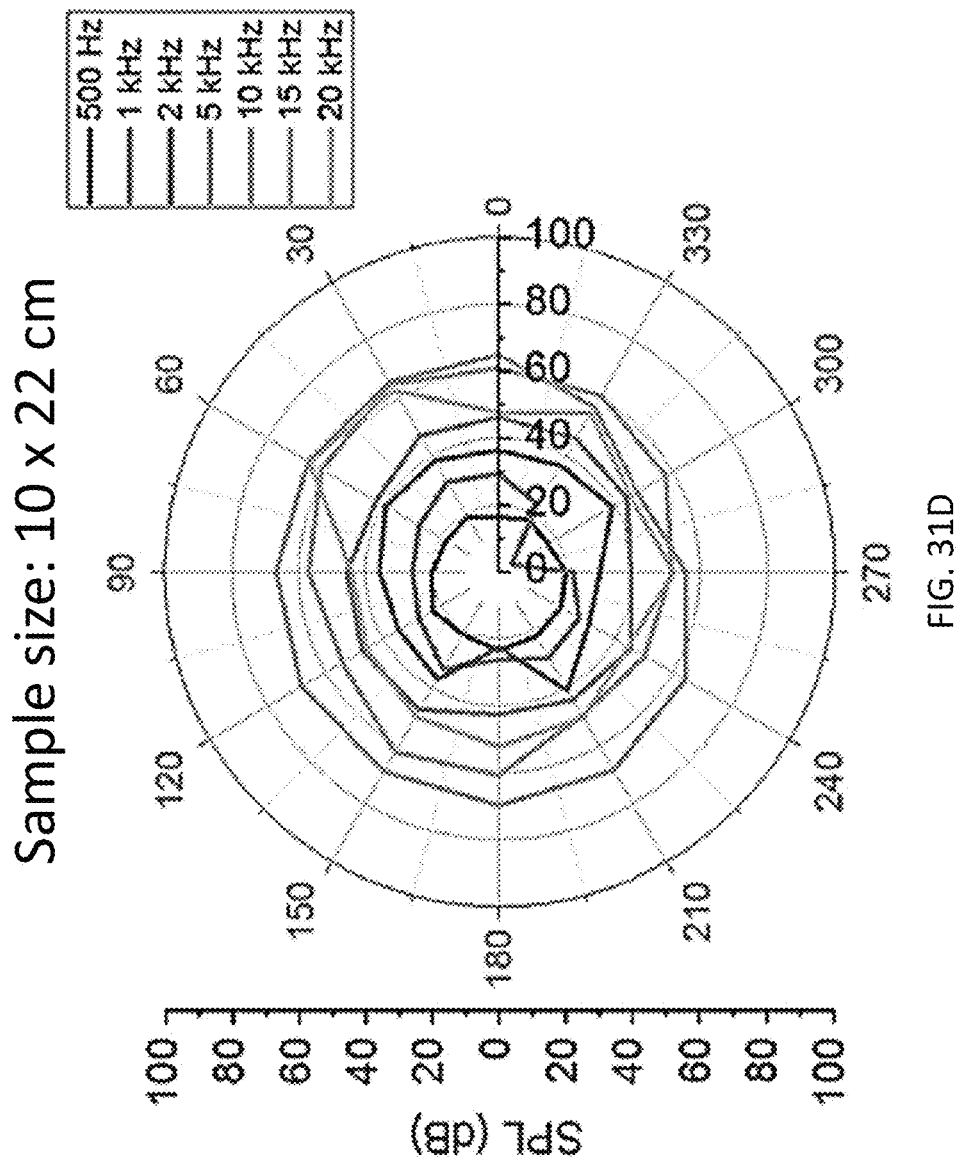
FIG. 31D is a directional graph of SPL measured in dB at different frequencies measured in kHz at different directional orientations of the loudspeaker, according to the present disclosure.

In reference to FIGS. 31A, 31B, 31C, and 31D, photographs of another experimental setup (FIGS. 31A and 31B) and associated results are provided (FIG. 31C: a graph of SPL measured in dB vs. frequency measured in Hz, and FIG. 31D: a directional graph of SPL measured in dB at different frequencies measured in kHz at different directional orientations of the loudspeaker). The result mentioned in reference to FIG. 30B is for a sample having dimensions of 14×22 cm with ITO coated glass electrodes. FIGS. 31A, 31B, and 31C show results where the sample size is reduced to 10×22 cm. The effect of speaker size can clearly be seen since the sound pressure level (SPL or dB) is decreased with reduced speaker size. Directivity results of the small sample, in particular, is shown in FIG. 31C. FIGS. 31B and 31D show the effect of directionality of the loudspeaker.

It should be appreciated that the novel transducer of the present disclosure can be scaled up using a roll-to-roll manufacturing process that can generate sizes, in accordance with one embodiment, of a width is 6" with practically no upper limit for the length except for the manufacturability in a roll-to-roll environment.

It should further be appreciated that the transparent and/or flexible structures disclosed herein as transducers can also be used as flexible and stretchable, transparent, conductive electrodes in various applications wherein both flexibility and/or transparency are required. The construction may include silver nanowire embedded films, field assisted aligned transparent conductive films, carbon nanotube filled stretchable films, and the like. The flexibility and stretchability of these electrodes is owed to conductive particles embedded in stretchable thermoplastics that can be formed into complex three dimensional shapes, e.g., loudspeakers; and/or conductive particle embedded in stretchable elastomeric materials such as various embodiments of rubbers (silicon and other synthetic rubbers), and a wide range of polyurethanes and copolymers. In particular, once the columns of the PZT/GNPs in PDMS are aligned by application of an electric field, they can be sandwiched between stretchable electrodes as discussed above for a particular application.

Thus, this novel transducer finds applications in a variety of area including wearable speakers, active noise cancellation systems in automobiles and aircrafts, transparent loudspeaker windows, self-read e-books or e-newspapers and television screens or computer monitors in which the screens provide simultaneous visual and audible functionalities. In addition, the transducer can be configured to be an ultrasensitive force sensors.

Figure 32:
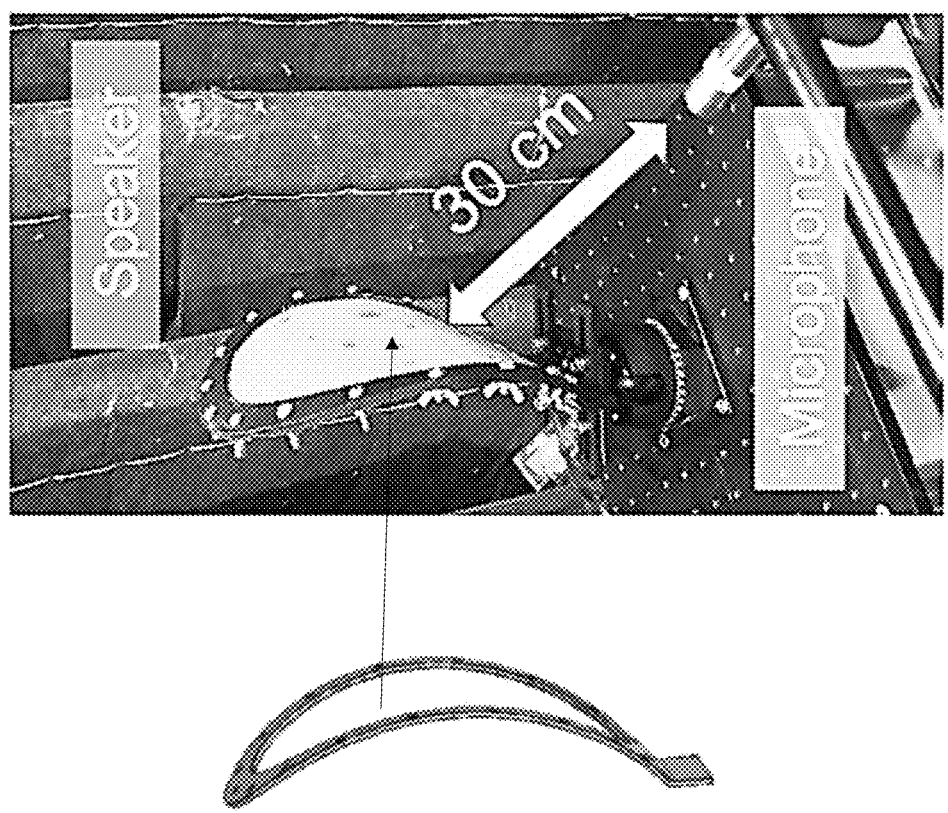
FIG. 32 is a photograph of a loudspeaker in a bent configuration is shown in a testing setup.
Figures 33A, 33B:
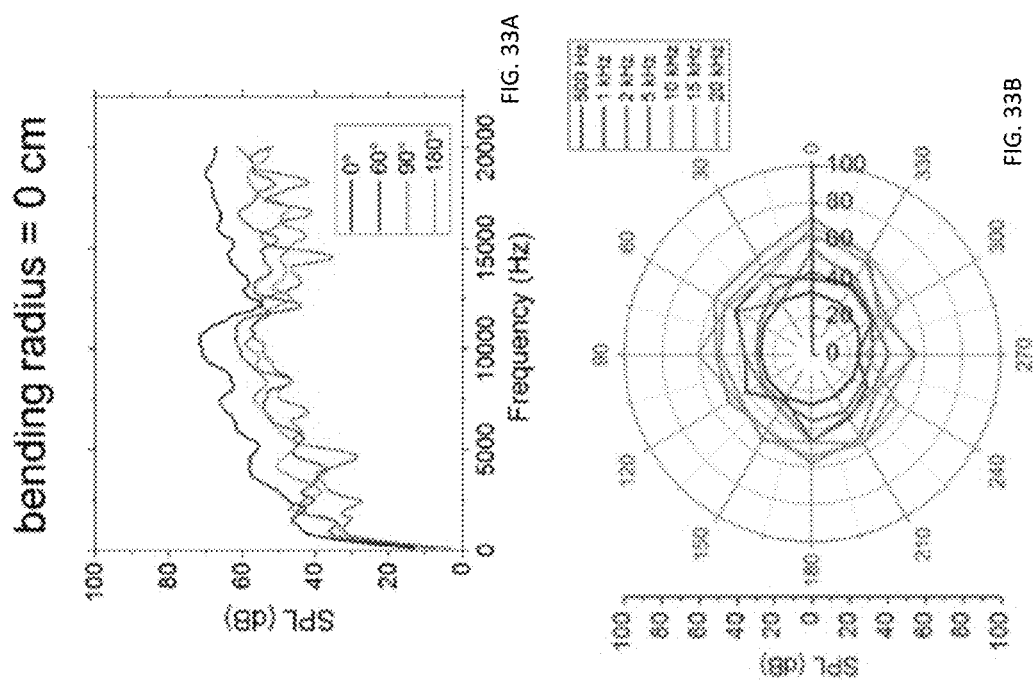
FIGS. 33A, 33C, and 33E are similar to FIG. 31C in which graphs of SPL measured in dB vs. frequency measured in Hz is provided showing the result of the loudspeaker of the present disclosure at different directional orientations of the loudspeaker are shown at different bending radii.
FIGS. 33B, 33D, and 33F are similar to FIG. 31D in which a directional graph of SPL measured in dB at different frequencies measured in kHz at different directional orientations of the loudspeaker are shown at different bending radii.
Figure 33C:
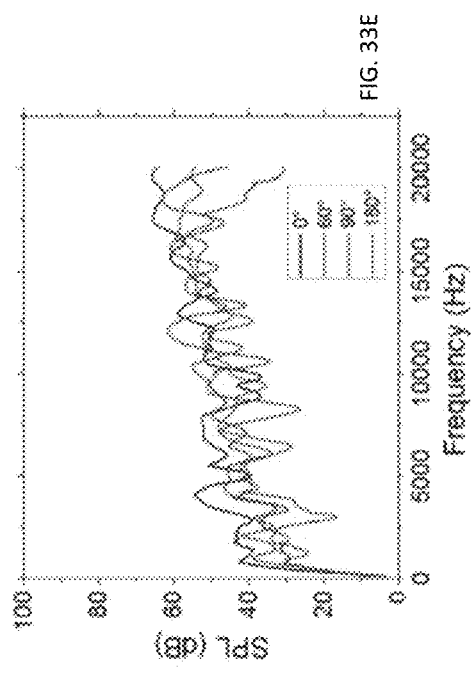
Figure 33D:
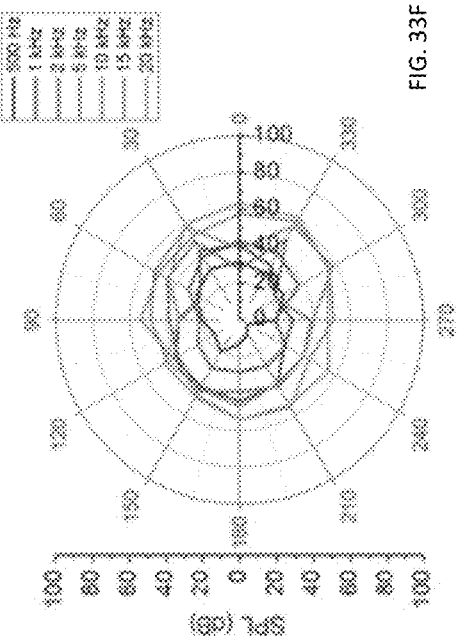
Figure 33E:
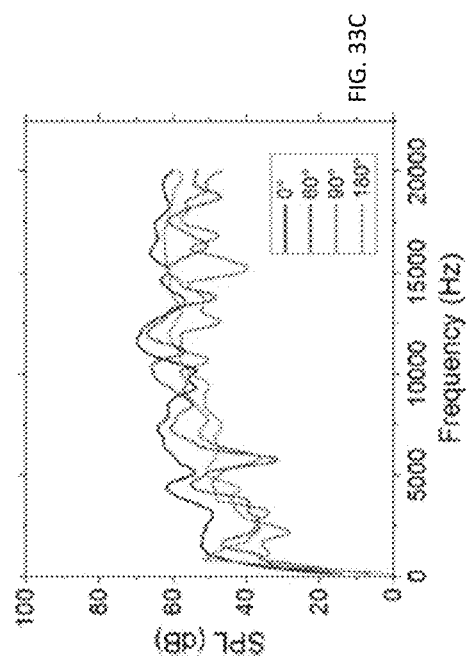
Figure 33F:
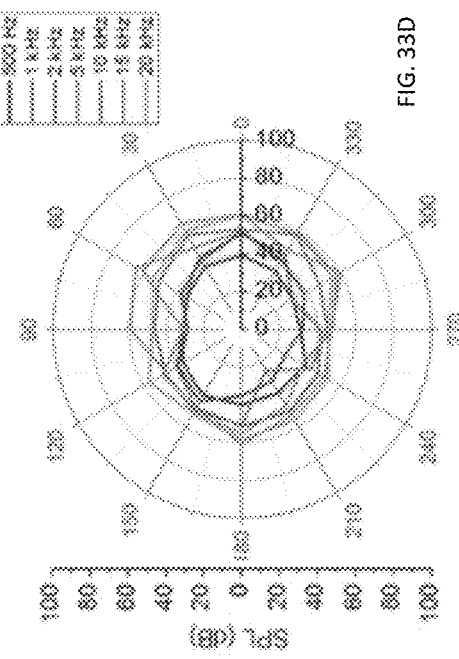
Figure 33H:
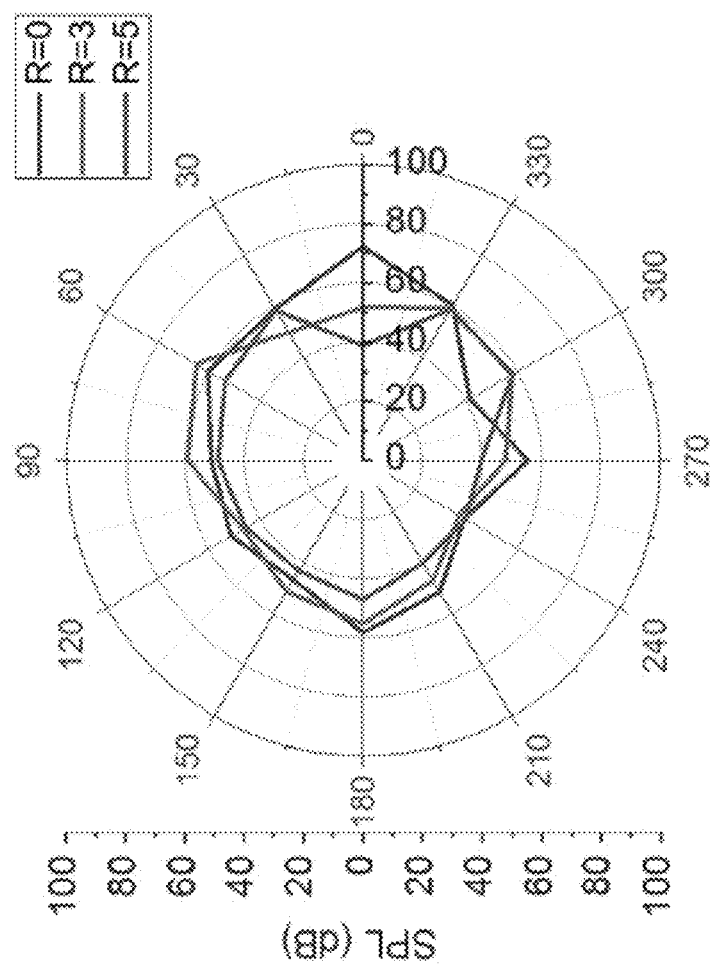
FIG. 33H is a directional graph of SPL measured in dB at different frequencies measured in kHz at different directional orientations of the loudspeaker is provided again at different bending radii shown in one unified graph.
Figure 33G:
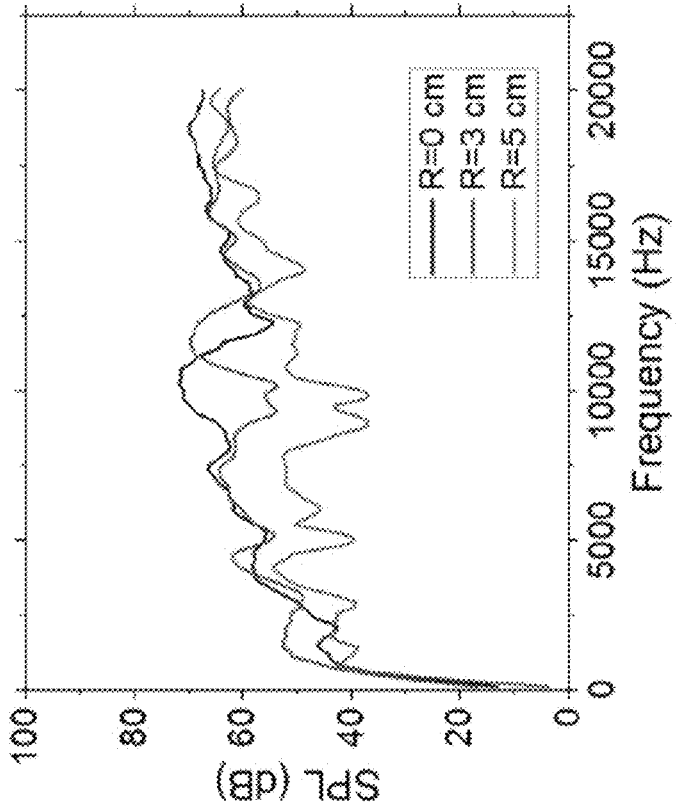
FIG. 33G is a graph of SPL measured in dB vs. frequency measured in Hz is provided showing the result of the loudspeaker of the present disclosure at different directional orientations and different bending radii shown in one unified graph.

The novel transducer described herein can also be used as a flexible loudspeaker. The impact of bending of the loudspeaker is shown in FIG. 32, where a photograph of a loudspeaker in a bent configuration is shown in a testing setup. The frame of the loudspeaker is shown in a panel adjacent the photograph. FIGS. 33A, 33B are similar to FIG. 31C (in which a graph of SPL measured in dB vs. frequency measured in Hz is provided showing the result of the loudspeaker of the present disclosure at different directional orientations of the loudspeaker) and FIG. 31D (in which a directional graph of SPL measured in dB at different frequencies measured in kHz at different directional orientations of the loudspeaker is provided) with a radius of 0 cm for the bent loudspeaker. FIGS. 33C-33D and 33E-33F are similar to FIGS. 33A and 33B but for radii of 3 cm and 5 cm. As can be seen, there is only a small impact as a result of these various radii. To show the effect in comparison to different radii, reference is made to FIGS. 33G (where a graph of SPL measured in dB vs. frequency measured in Hz is provided showing the result of the loudspeaker of the present disclosure at different directional orientations and different bending radii) and 33H (where a directional graph of SPL measured in dB at different frequencies measured in kHz at different directional orientations of the loudspeaker is provided again at different bending radii).

Figures 34A, 34B:
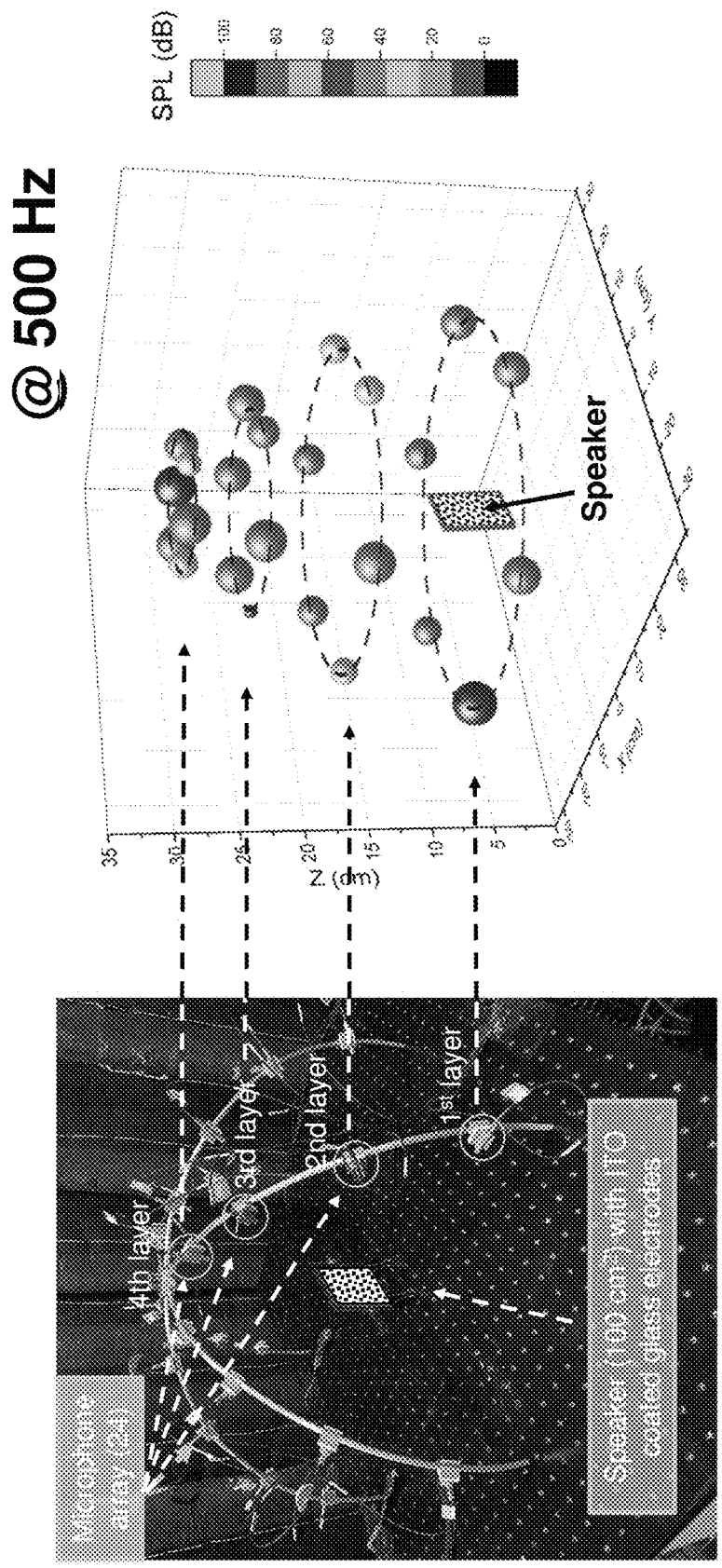
FIG. 34A is a photograph of the test setup is shown for a three-dimensional SPL measurement of the loudspeaker of the present disclosure.
FIG. 34B is a three-dimensional SPL graph for the test setup of FIG. 34A when the loudspeaker is adapted to provide sound at 500 Hz.
Figure 34C:
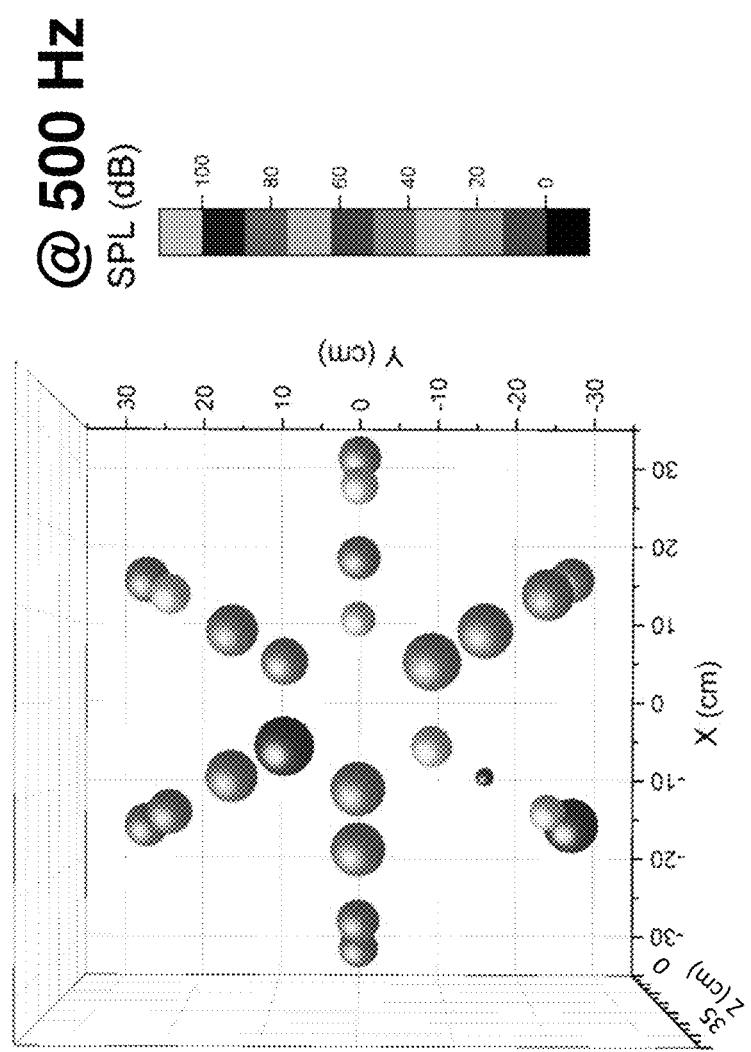
FIG. 34C is a top view of the SPL output of FIG. 34B.
Figure 34E:
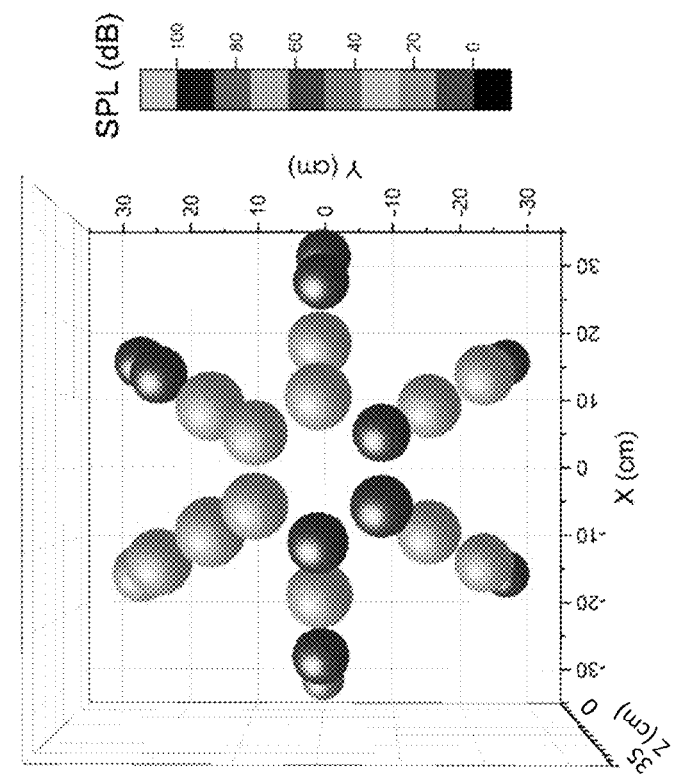
FIG. 34E is similar to FIG. 34C but for an output of 3 kHz.
Figure 34D:
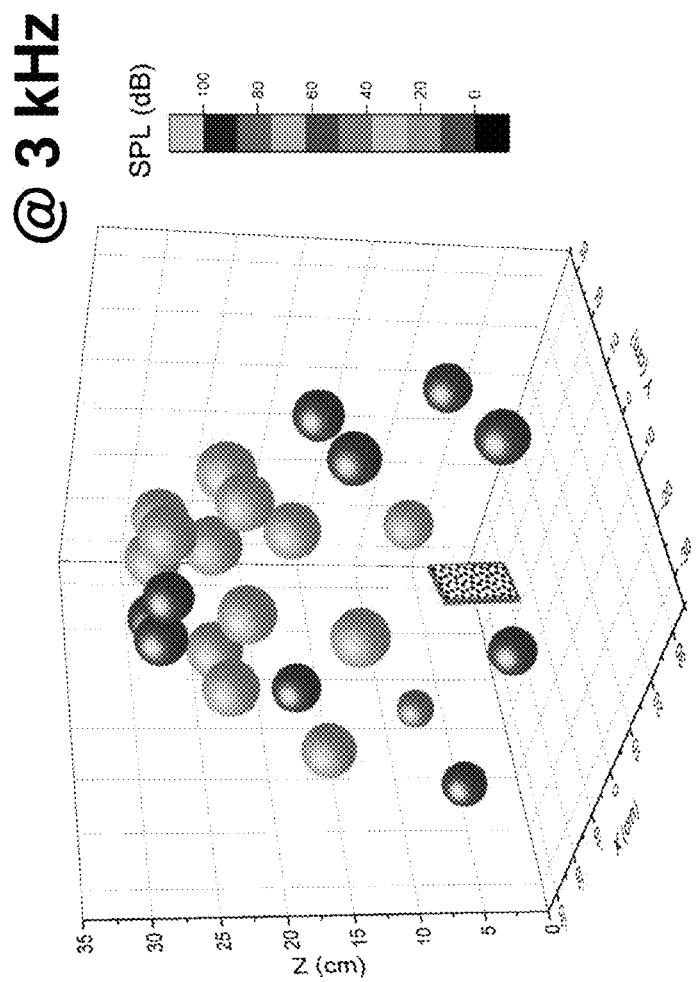
FIG. 34D is similar to FIG. 34B but for an output of 3 kHz.
Figure 34G:
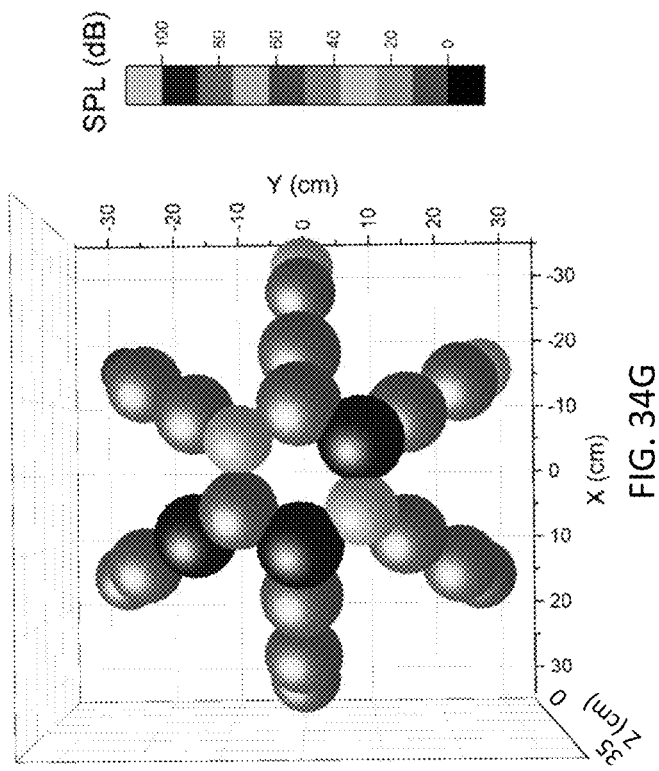
FIG. 34G is similar to FIG. 34C but for an output of 10 kHz.
Figure 34F:
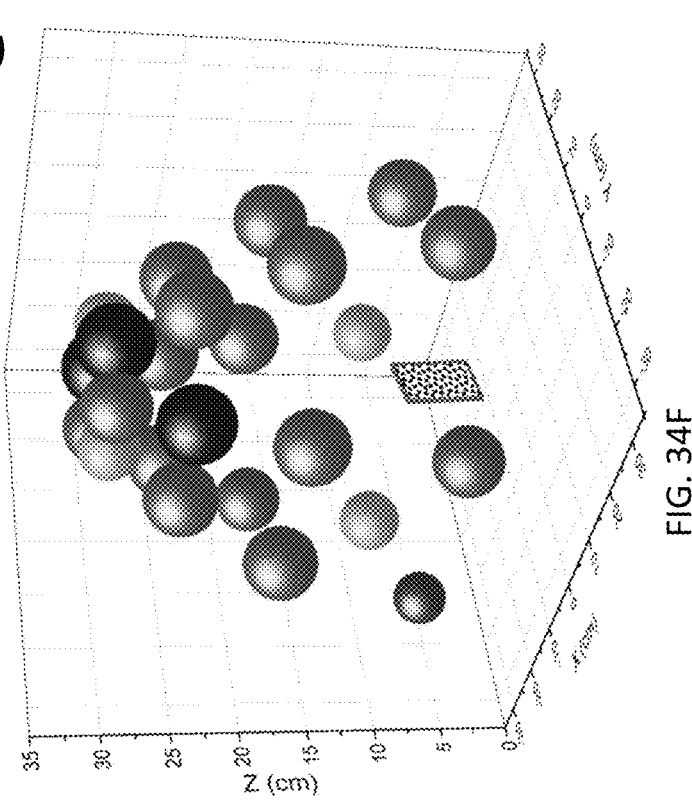
FIG. 34F is similar to FIG. 34B but for an output of 10 kHz.
Figure 34I:
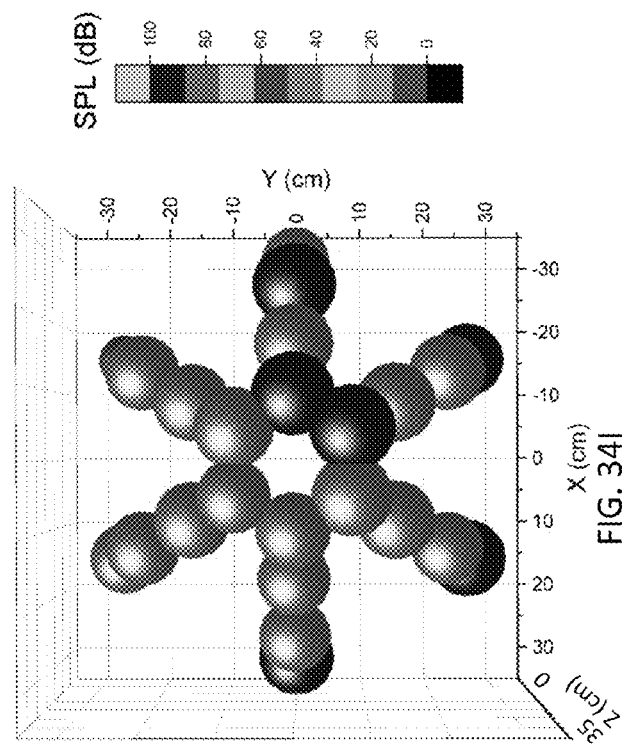
FIG. 34I is similar to FIG. 34C but for an output of 15 kHz.
Figure 34H:
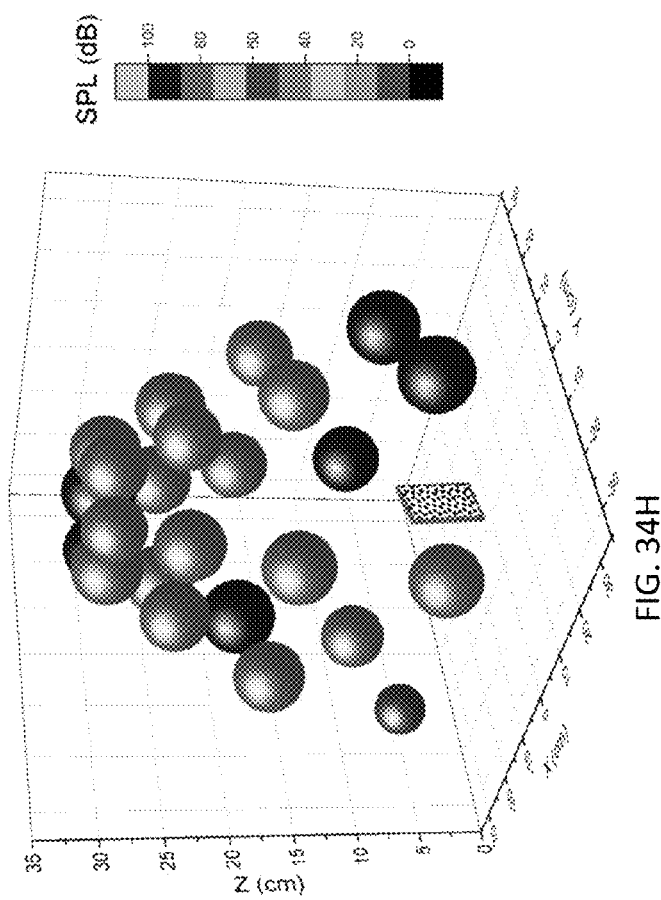
FIG. 34H is similar to FIG. 34B but for an output of 15 kHz.
Figure 35:
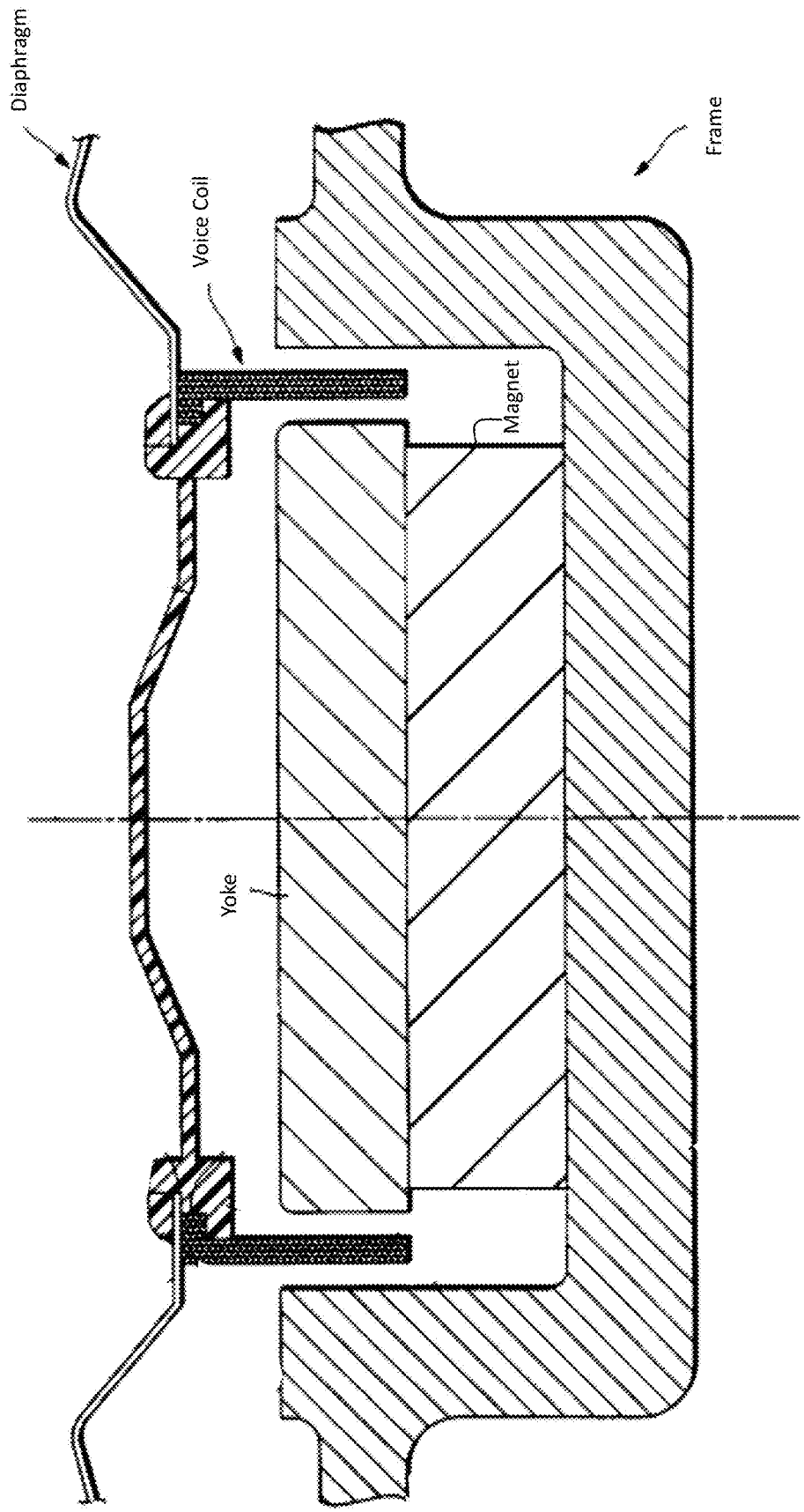
FIG. 35 is a schematic of a prior art speaker.

The loudspeaker, according to the present disclosure is further characterized with a three-dimensional array of microphones. A circuit coupled to the loudspeaker is a designed to provide sound at various frequencies (e.g., 500 Hz, 3 kHz, 10 kHz, and 15 kHz). This characterization provides insight into SPL measurements at different heights and different radii away from the loudspeaker in a dome-like fashion. Referring to FIG. 34A, a photograph of the test setup is shown for a three-dimensional SPL measurement. The loudspeaker according to the present disclosure is placed on the base of the dome about its center, and four layers of microphones are placed above the loudspeaker about the surface of the dome. The SPL measurements are shown in FIG. 34B which represent SPL measurements when the loudspeaker is outputting sound at 500 Hz. A color chart is provided adjacent the dome-like schematic of SPL output (FIG. 34B), which provides according to the color chart the SPL output at different levels as measured by the corresponding microphones. Referring to FIG. 34C a top-view of the view provided in FIG. 34B is shown. FIG. 34D is similar to FIG. 34B but for an output of 3 kHz. FIG. 34E is similar to FIG. 34C but for an output of 3 kHz. FIG. 34F is similar to FIG. 34B but for an output of 10 kHz. FIG. 34G is similar to FIG. 34C but for an output of 10 kHz. FIG. 34H is similar to FIG. 34B but for an output of 15 kHz. FIG. 34I is similar to FIG. 34C but for an output of 15 kHz.

While the present disclosure has been described in terms of specific or particular embodiments and investigations, it should be apparent that alternatives could be adopted by one skilled in the art. For example, piezoelectric composite devices could differ in appearance and construction from the embodiments described herein, various amounts of PZT and electrically conductive nanoparticles could be combined in a variety of polymer matrix materials, process parameters such as temperatures and durations could be modified, and appropriate materials could be substituted for those noted. In addition, the present disclosure encompasses additional or alternative embodiments in which one or more features or aspects of different disclosed embodiments may be omitted or combined. Accordingly, it should be understood that the present disclosure is not necessarily limited to any embodiment described herein or illustrated in the drawings. It should also be understood that the phraseology and terminology employed above are for the purpose of describing the disclosed and illustrated embodiments and investigations, and do not necessarily serve as limitations to the scope of the present disclosure. Therefore, the scope of the present disclosure is to be limited only by the following claims.

The invention claimed is:

1. A method of transducing electrical energy to sound, comprising:
   providing a transducer, the transducer comprising:
   lead zirconate titanate (PZT) particles mixed with graphene nanoplatelets (GNPs) in a flexible substrate aligned in a first direction, forming a transducer subsystem, a first conductive protective electrode having a width and a length configured to provide a first electrical connectivity to an external circuit, and a second conductive protective electrode having the width and the length configured to provide a second electrical connectivity to the external circuit, wherein the transducer subsystem is sandwiched between the first and second conductive protective electrodes; and providing an external circuit configured to provide an electrical signal to the first and second conductive protective electrodes to thereby transduce the electrical signal to sound.

2. The method of claim 1, wherein the substrate is a an organic-based silicon polymer.

3. The method of claim 2, wherein the organic-based silicon polymer is polydimethylsiloxane (PDMS) having a chemical formula of $CH_3[Si(CH_3)_2O]_nSi(CH_3)_3$, where n is a number of repeating monomer $(SiO(CH_3)_2)$.

4. The method of claim 1, wherein the transducer forms a loudspeaker.

5. The method of claim 4, wherein the loudspeaker has a frequency response between 20 Hz and 20,000 Hz.

6. The method of claim 5, wherein the loudspeaker produces a high-output Sound Pressure Level (SPL) of between about 0 dB and 80 dB measured by a microphone placed about 30 cm away from the loudspeaker.

7. The method of claim 4, wherein the loudspeaker is (i) transparent, (ii) flexible, or (iii) both transparent and flexible.

8. The method of claim 7, wherein the first and second conductive protective electrodes are made of Indium Tin Oxide (ITO)-coated polyethylene terephthalate (PET).

9. The method of claim 8, wherein the ITO-coated PET electrodes provide a light transmission of about 80% for light having a wavelength of between about 400 nm to about 2200 nm.

10. The method of claim 8, wherein the ITO-coated PET electrodes provide a degree of flexibility between about 0° and 180°.

11. The method of claim 7, wherein the first and second conductive protective electrodes are made of glass.

12. The method of claim 11, wherein the first and second conductive protective electrodes are flat or curved.

13. The method of claim 4, wherein the loudspeaker can be scalable in size up to about 6" in width with length limited by a roll-to-roll machine.

14. The method of claim 1, wherein the first and second conductive protective electrodes are stretchable.

15. The method of claim 1, wherein the first and second conductive protective electrodes are made of conductive particles embedded in one of stretchable thermoplastic, elastomeric materials, and combination thereof.

16. The method of claim 15, wherein the elastomeric materials is selected from the group consisting of silicon, synthetic rubbers, polyurethanes, and copolymers.

17. The method of claim 1 wherein the PZT particles and the GNPs are aligned via an electric field.

* * * * *